(12) United States Patent
Chandrasekharan et al.

(10) Patent No.: US 12,071,689 B2
(45) Date of Patent: Aug. 27, 2024

(54) TRIM AND DEPOSITION PROFILE CONTROL WITH MULTI-ZONE HEATED SUBSTRATE SUPPORT FOR MULTI-PATTERNING PROCESSES

(71) Applicant: LAM RESEARCH CORPORATION, Fremont, CA (US)

(72) Inventors: Ramesh Chandrasekharan, Lake Oswego, OR (US); Michael Philip Roberts, Tigard, OR (US); Pulkit Agarwal, Beaverton, OR (US); Adrien Lavoie, Newberg, OR (US); Ravi Kumar, Beaverton, OR (US); Nuoya Yang, Portland, OR (US); Chan Myae Myae Soe, Santa Clara, CA (US); Ashish Saurabh, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 288 days.

(21) Appl. No.: 17/429,882

(22) PCT Filed: Feb. 12, 2020

(86) PCT No.: PCT/US2020/017922
§ 371 (c)(1),
(2) Date: Aug. 10, 2021

(87) PCT Pub. No.: WO2020/167944
PCT Pub. Date: Aug. 20, 2020

(65) Prior Publication Data
US 2022/0205105 A1  Jun. 30, 2022

Related U.S. Application Data

(60) Provisional application No. 62/870,150, filed on Jul. 3, 2019, provisional application No. 62/806,000, filed on Feb. 15, 2019.

(51) Int. Cl.
*C23C 16/52* (2006.01)
*C23C 16/455* (2006.01)
(Continued)

(52) U.S. Cl.
CPC ........ *C23C 16/52* (2013.01); *C23C 16/45544* (2013.01); *C23C 16/46* (2013.01);
(Continued)

(58) Field of Classification Search
USPC ................................. 700/108–110, 121, 210
See application file for complete search history.

(56) References Cited

U.S. PATENT DOCUMENTS

| 8,173,450 B1 | 5/2012 | Tian et al. |
|---|---|---|
| 10,113,233 B2 | 10/2018 | Chang et al. |

(Continued)

FOREIGN PATENT DOCUMENTS

| CN | 101111934 A | 1/2008 |
|---|---|---|
| CN | 103123906 A | 5/2013 |

(Continued)

OTHER PUBLICATIONS

Office Action issued in corresponding Taiwanese Patent Application 109104474 dated Sep. 8, 2023.
International Search Report and Written Opinion of the ISA issued in PCT/US2020/017922, mailed Jun. 12, 2020; ISA/KR.
Office Action issued in corresponding Chinese Patent Application 202080026510X dated Jun. 5, 2024.

*Primary Examiner* — Sean Shechtman

(57) ABSTRACT

A substrate processing system is provided and includes a substrate support, a memory, and calibration, operating parameter, and solving modules. The substrate support supports a substrate and includes temperature control elements. The memory stores, for the temperature control elements, temperature calibration values and sensitivity calibration values. The calibration module, during calibration of the temperature control elements, performs a first calibration process to determine the temperature calibration values or a (Continued)

second calibration process to determine the sensitivity calibration values. The sensitivity calibration values relate at least one of trim amounts or deposition amounts to temperature changes. The operating parameter module determines operating parameters for the temperature control elements based on the temperature and sensitivity calibration values. The solving module, subsequent to the calibration of the temperature control elements, controls operation of the temperature control elements during at least one of a trim or deposition step based on the operating parameters.

22 Claims, 27 Drawing Sheets

(51) Int. Cl.
*C23C 16/46* (2006.01)
*G05B 19/401* (2006.01)
(52) U.S. Cl.
CPC .. *G05B 19/401* (2013.01); *G05B 2219/45031* (2013.01); *G05B 2219/50333* (2013.01)

(56) References Cited

U.S. PATENT DOCUMENTS

| | | |
|---|---|---|
| 2004/0087042 A1 | 5/2004 | Ghyselen et al. |
| 2008/0032426 A1* | 2/2008 | Michaelson ............ H01L 22/12 |
| | | 257/E21.53 |
| 2010/0022033 A1 | 1/2010 | Kanarik et al. |
| 2017/0215230 A1 | 7/2017 | Parkhe |

FOREIGN PATENT DOCUMENTS

| | | | | |
|---|---|---|---|---|
| EP | 1547143 A2 * | 6/2005 | ....... | H01L 21/02238 |
| FR | 2843487 A1 | 2/2004 | | |
| TW | 200818259 A | 4/2008 | | |
| TW | I481297 B | 4/2015 | | |
| TW | 201541553 A | 11/2015 | | |
| WO | WO-2004015759 A2 | 2/2004 | | |
| WO | WO-2006094162 A2 | 9/2006 | | |
| WO | WO-2018112192 A1 | 6/2018 | | |

* cited by examiner

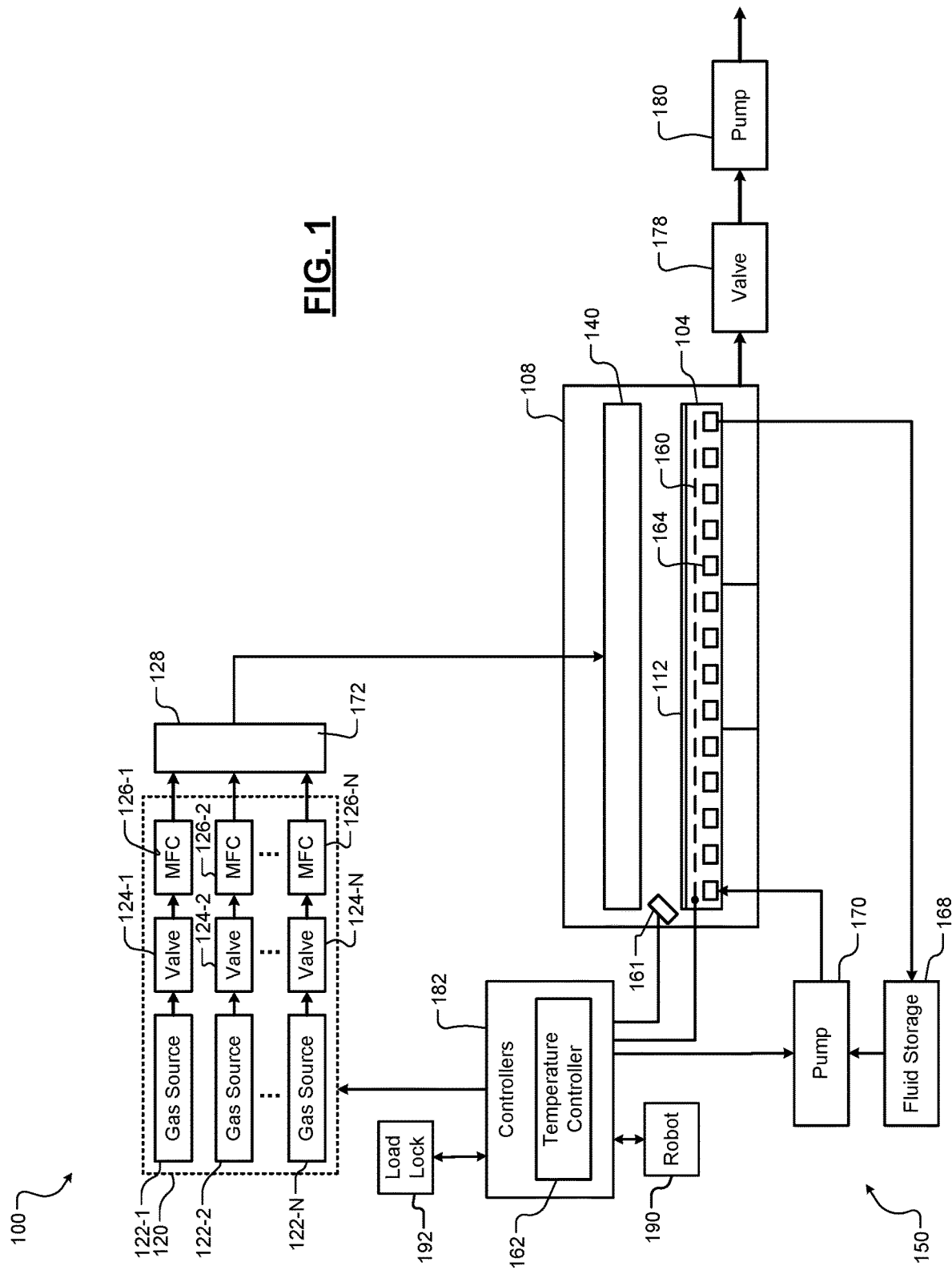

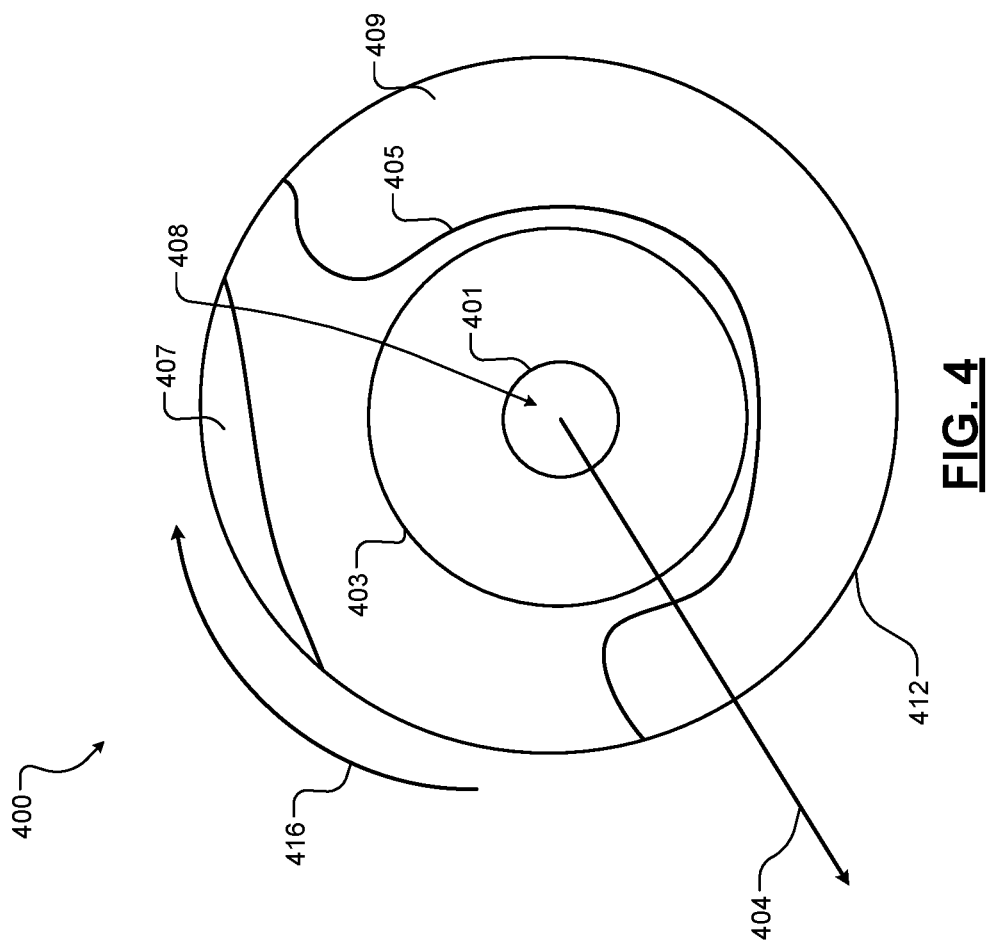

TRIM AND DEPOSITION PROFILE CONTROL WITH MULTI-ZONE HEATED SUBSTRATE SUPPORT FOR MULTI-PATTERNING PROCESSES

CROSS-REFERENCE TO RELATED APPLICATIONS

This application is a U.S. National Phase Application under 35 U.S.C. 371 of International Application No. PCT/US2020/017922, filed on Feb. 12, 2020, which claims the benefit of U.S. Provisional Application No. 62/806,000, filed on Feb. 15, 2019 and U.S. Provisional Application No. 62/870,150, filed on Jul. 3, 2019. The entire disclosures of the applications referenced above are incorporated herein by reference.

FIELD

The present disclosure relates to double patterning processes in an atomic layer deposition substrate processing chamber, and more particularly to trim and deposition profile control.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more process gases may be delivered by a gas delivery system to the processing chamber. In some systems, the gas delivery system includes a manifold connected to a showerhead that is located in the processing chamber. In some examples, the process deposits a thin film on a substrate using atomic layer deposition (ALD).

SUMMARY

A substrate processing system is provided and includes a substrate support, a memory, a calibration module, an operating parameter module, and a solving module. The substrate support is configured to support a first substrate and includes temperature control elements. The memory is configured to store, for the temperature control elements, temperature calibration values and sensitivity calibration values. The calibration module is configured to, during calibration of the temperature control elements, perform a first calibration process to determine the temperature calibration values or a second calibration process to determine the sensitivity calibration values. The sensitivity calibration values relate at least one of trim amounts to temperature changes or deposition amounts to temperature changes. The operating parameter module is configured to determine operating parameters for the temperature control elements based on the temperature calibration values and the sensitivity calibration values. The solving module is configured to, subsequent to the calibration of the temperature control elements, control operation of the temperature control elements during at least one of a trim step or a deposition step based on the operating parameters.

In other features, the substrate support includes temperature controlled zones. Each of the temperature controlled zones includes one or more of the temperature control elements. In other features, the solving module is configured to perform at least one of open loop or closed loop control of each of the temperature controlled zones. In other features, the at least one of the temperature controlled zones or the temperature control elements is implemented in an open loop or a closed loop. In other features, the solving module is configured to perform at least one of open loop or closed loop control of temperature control elements.

In other features, the first calibration process includes: adjusting a parameter of the temperature control elements by a predetermined amount; determining temperature changes of the first substrate or substrate support in response to the adjusted parameter; and based on the predetermined amount and the determined temperature changes, generating the temperature calibration values.

In other features, the second calibration process includes: determining a baseline critical dimension profile of a second substrate provided as a result of the temperature control elements being at first settings for a trim operation performed on the second substrate; adjusting a parameter of at least one of the temperature control elements from one of the first settings to a second setting; performing the trim operation on a third substrate; measuring a post trim critical dimension profile for the third substrate; and determining one of the sensitivity calibration values based on the baseline critical dimension profile, the post trim critical dimension profile and a difference between the one of the first settings and the second setting.

In other features, the second calibration process includes: determining a baseline critical dimension profile of a second substrate provided as a result of the temperature control elements being at first settings for a deposition operation performed on the second substrate; adjusting a parameter of at least one of the temperature control elements from one of the first settings to a second setting; performing the deposition operation on a third substrate; measuring a post deposition critical dimension profile for the third substrate; and determining one of the sensitivity calibration values based on the baseline critical dimension profile, the post deposition critical dimension profile and a difference between the one of the first settings and the second setting.

In other features, the substrate processing system further includes a user interface configured to receive a target profile. The solving module is configured to control operation of the temperature control elements during the at least one of the trim step or the deposition step based on the target profile.

In other features, the operating parameter module is configured to analyze the sensitivity calibration values and parameter variability for a predetermined process to determine radial tuning parameters. The solving module is configured to control operation of the temperature control elements during the at least one of the trim step or the deposition step based on the radial tuning parameters.

In other features, the operating parameter module is configured to analyze the sensitivity calibration values and azimuthal variability for a predetermined process to determine azimuthal tuning parameters. The solving module is configured to control operation of the temperature control elements during the at least one of the trim step or the deposition step based on the azimuthal tuning parameters.

In other features, the operating parameter module is configured to: determine values corresponding to critical dimensions of a feature of the first substrate; determine trim, pretrim and deposition values based on the values; determine a total correction value based on the trim, pretrim, and deposition values, and analyze the sensitivity calibration values, parameter variability and the total correction value for a predetermined process to determine radial tuning parameters. The solving module is configured to control operation of the temperature control elements during the at least one of the trim step or the deposition step based on the radial tuning parameters.

In other features, the operating parameter module is configured to: determine critical dimension imbalance; and analyze the sensitivity calibration values, parameter variability and the critical dimension imbalance for a predetermined process to determine radial tuning parameters. The solving module is configured to control operation of the temperature control elements during the at least one of the trim step or the deposition step based on the radial tuning parameters.

In other features, a substrate processing system is provided and includes a substrate support, a calibration module, an operating parameter module and a solving module. The substrate support includes temperature control elements. The calibration module is configured to: determine a baseline critical dimension of a first substrate provided as a result of one of the temperature control elements being at a first setting for a trim operation performed on a first substrate; adjust a parameter of the one of the temperature control elements from the first setting to a second setting; perform the trim operation on a second substrate; measure a post trim critical dimension for the second substrate; and determine a first sensitivity calibration value based on the baseline critical dimension, the post trim critical dimension and a difference between the first setting and the second setting. The operating parameter module is configured to determine a first operating parameter for the one of the temperature control elements based on the first sensitivity calibration value. The solving module is configured to, subsequent to the calibration of the one of the temperature control elements, control operation of the one of the temperature control elements during a trim step based on the operating parameter.

In other features, the calibration module is configured to determine a baseline critical dimension profile of the first substrate provided as a result of the temperature control elements being at first settings for the trim operation performed on the first substrate. The baseline critical dimension profile includes the baseline critical dimension. The first settings include the first setting of the one of the temperature control elements. The calibration module is configured to, subsequent to performing the trim operation on a second substrate, measure a post trim critical dimension profile for the second substrate. The post trim critical dimension profile includes the post trim critical dimension. The calibration module is configured to determine one or more sensitivity calibration values based on the baseline critical dimension profile, the post trim critical dimension profile and a difference between the one of the first settings and the second setting. The one or more sensitivity calibration values include the first sensitivity calibration value. The operating parameter module is configured to determine one or more operating parameters for the temperature control elements based on the one or more sensitivity calibration values. The one or more operating parameters include the first operating parameter. The solving module is configured to, subsequent to the calibration of the temperature control elements, control operation of the temperature control elements during a trim step based on the one or more operating parameters.

In other features, the calibration module is configured to: determine a first difference between the baseline critical dimension and the post trim critical dimension for the one of the temperature control elements; determine a second difference between the first setting and the second setting; and determine the sensitivity calibration value for the one of the temperature control elements based on the first difference and the second difference.

In other features, the operating parameter module is configured to: receive a target critical dimension; calculate a difference between the target critical dimension and at least one of the baseline critical dimension and the post trim critical dimension; and based on the difference, determine a temperature setting of the one or the temperature control elements to achieve the target critical dimension.

In other features, the operating parameter module is configured to: receive a target trim critical dimension; calculate a difference between the target trim critical dimension and at least one of the baseline critical dimension or the post trim critical dimension; and determine a temperature setting to achieve the target trim critical dimension based on the sensitivity calibration value and the difference between the target trim critical dimension and the at least one of the baseline critical dimension or the post trim critical dimension. The solving module is configured to, subsequent to the calibration of the one of the temperature control elements, control operation of the one of the temperature control elements during a trim step based on the temperature setting.

In other features, a substrate processing system is provided and includes a substrate support, a calibration module, an operating parameter module, and a solving module. The substrate support includes temperature control elements. The calibration module is configured to: determine a baseline critical dimension of a first substrate provided as a result of one of the temperature control elements being at a first setting for a deposition operation performed on a first substrate; adjust a parameter of the one of the temperature control elements from the first setting to a second setting; perform the deposition operation on a second substrate; measure a post deposition critical dimension for the second substrate; and determine a first sensitivity calibration value based on the baseline critical dimension, the post deposition critical dimension and a difference between the first setting and the second setting. The operating parameter module is configured to determine a first operating parameter for the one of the temperature control elements based on the first sensitivity calibration value. The solving module is configured to, subsequent to the calibration of the one of the temperature control elements, control operation of the one of the temperature control elements during a trim step based on the operating parameter.

In other features, the calibration module is configured to determine a baseline critical dimension profile of the first substrate provided as a result of the temperature control elements being at first settings for the deposition operation performed on the first substrate. The baseline critical dimension profile includes the baseline critical dimension. The first settings include the first setting of the one of the temperature control elements. The calibration module is configured to, subsequent to performing the deposition operation on a second substrate, measure a post deposition critical dimension profile for the second substrate. The post deposition critical dimension profile includes the post deposition critical dimension. The calibration module is configured to determine one or more sensitivity calibration values based on the baseline critical dimension profile, the post deposition critical dimension profile and a difference between the one of the first settings and the second setting. The one or more sensitivity calibration values include the first sensitivity calibration value. The operating parameter module is configured to determine one or more operating parameters for the temperature control elements based on the one or more sensitivity calibration values. The one or more operating parameters include the first operating parameter. The solving module is configured to, subsequent to the calibration of the temperature control elements, control operation of the temperature control elements during a trim step based on the one or more operating parameters.

In other features, the calibration module is configured to: determine a first difference between the baseline critical dimension and the post deposition critical dimension for the one of the temperature control elements; determine a second difference between the first setting and the second setting; and determine the sensitivity calibration value for the one of the temperature control elements based on the first difference and the second difference.

In other features, the operating parameter module is configured to: receive a target critical dimension; calculate a difference between the target critical dimension and at least one of the baseline critical dimension and the post deposition critical dimension; and based on the difference, determine a temperature setting of the one or the temperature control elements to achieve the target critical dimension.

In other features, the operating parameter module is configured to: receive a target deposition critical dimension; calculate a difference between the target deposition critical dimension and at least one of the baseline critical dimension or the post deposition critical dimension; determine a temperature setting to achieve the target deposition critical dimension based on the sensitivity calibration value and the difference between the target deposition critical dimension and the at least one of the baseline critical dimension or the post deposition critical dimension; and the solving module is configured to, subsequent to the calibration of the one of the temperature control elements, control operation of the one of the temperature control elements during a deposition step based on the temperature setting.

In other features, a substrate processing system is provided and includes a process chamber, a memory, and a controller. The process chamber includes stations, where each of the stations has a respective substrate support. The substrate supports include temperature control elements. The memory is configured to store, for the temperature control elements, temperature calibration values. The controller is configured to iteratively perform a calibration process to calibrate the temperature control elements. Each iteration of the calibration process is for a respective one of the stations and includes: setting the process chamber and substrate supports to a first predetermined temperature; running the process chamber according to one of multiple recipes; waiting until a steady-state condition exists in the process chamber; loading a thermocouple substrate in the respective one of the stations; determining whether a temperature of the thermocouple substrate is greater than or equal to a second predetermined temperature; waiting a predetermined period after the temperature of the thermocouple substrate is greater than or equal to the second predetermined temperature; and collecting temperature data via the thermocouple substrate. The temperature controller is configured to: calculate A-matrices respectively for the stations based on the temperature data collected for the stations, where the A-matrices include the temperature calibration values; and control operation of the plurality of temperature control elements during at least one of a trim step or a deposition step based on the A-matrices.

In other features, the controller is configured to: determine whether at least one of the process chamber or the substrate support in the respective one of the stations is greater than or equal to the first predetermined temperature; if at least one of the process chamber or the substrate support in the respective one of the stations is greater than or equal to the first predetermined temperature, determine whether the steady-state condition exists; and if the steady-state condition exists, load the thermocouple wafer in the respective one of the plurality of stations.

In other features, for each of the iterations, the temperature controller is configured to load the thermocouple substrate in one of the stations and load dummy substrates in the other ones of the stations. In other features, the controller is configured to link the collected temperature data for each of the stations to locations of the thermocouple substrate for each of the iterations.

In other features, each of the A-matrices is for one of the substrate supports and a respective one of the plurality of recipes. In other features, the controller is configured to determining the A-matrices based on: initial duty cycles of power signals provided to the temperature control elements while setting the process chamber and substrate supports to the first predetermined temperature; target duty cycles of power signals provided to the temperature control elements for a current recipe; initial temperatures of the thermocouple substrate or the substrate supports; and target temperatures of the thermocouple substrate or the substrate supports. In other features, the controller is configured to determining the A-matrices based on a weighting matrix, which weights zones of the thermocouple substrate or the substrate supports differently.

In other features, a substrate processing system is provided and includes a process chamber, a memory, and a controller. The process chamber includes stations, where each of the stations has a respective substrate support. The substrate supports includes temperature control elements. The memory is configured to store metrology data and sensitivity calibration values. Each of the sensitivity calibration values is based on a substrate critical dimension and a corresponding temperature. The controller is configured to iteratively perform a calibration process to determine the sensitivity calibration values. Each iteration of the calibration process is for a respective one of the stations and includes: setting the process chamber and substrate supports to a first predetermined temperature; running the process chamber according to one of multiple recipes; waiting until a steady-state condition exists in the process chamber; loading one or more blank substrates respectively in a selected one or more of the stations; running the process chamber according to a target process; and performing a metrology scan of the one or more blank substrates to obtain the metrology data. The temperature controller is configured to: calculate S-matrices respectively for the stations based on the metrology data for the iterations of the calibration process, where the S-matrices include the sensitivity calibration values; and control operation of the temperature control elements during at least one of a trim step or a deposition step based on the S-matrices.

In other features, the controller is configured to wait a predetermined period after initiating the running of the target process to perform the metrology scan. In other features, the controller is configured to: perform the metrology scan subsequent to initiating the running of the target process; perform another metrology scan prior to initiating the running of the target process to collect additional metrology data; and calculate the S-matrices based on the additional metrology data.

In other features, each of the S-matrices is for one of the substrate supports and a respective one of the recipes. In other features, the controller loads two or more blank substrates in respective ones of the stations for each of the iterations of the calibration process.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example of a substrate processing system including a temperature control system in accordance with an embodiment of the present disclosure;

FIG. 4 shows example of radial and azimuthal non-uniformities in etch amounts on a surface of a substrate;

In the drawings, reference numbers may be reused to identify similar and/or identical elements.

DETAILED DESCRIPTION

Figure 2A:
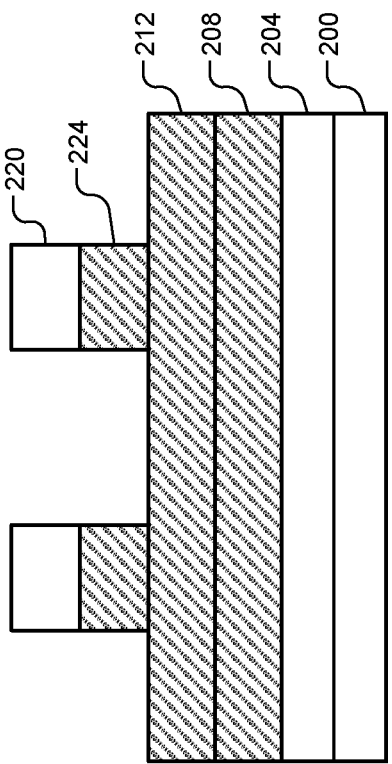
FIGS. 2A through 2K illustrate an example of a double patterning atomic layer deposition process.

In film deposition processes such as atomic layer deposition (ALD), various properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. The NU may be reduced either by, for example, addressing a direct cause of the NU and/or introducing a counteracting NU to compensate and cancel the existing NU. Material may be intentionally deposited and/or removed non-uniformly during certain steps of a process to compensate for known non-uniformities occurring at other upstream or downstream steps in the process.

Multi-patterning processes, such as double patterning (DPT) ALD processes (e.g., a self-aligned double patterning process), may include one or more lithography steps, trim steps, and/or sacrificial spacer layer deposition steps. Multi-patterning is used to improve feature density in lithography systems. Each step in a multi-patterning process may have associated NUs affecting overall critical dimension (CD) NU and imbalance. As an example, a critical dimension may refer to a width of a feature after trimming and/or depositing a spacer layer on the feature. Trimming decreases the width of the feature. Applying a spacer layer on the feature increases the overall width of the feature. Non-uniformity as a result of performing a trim step may result in non-uniform double patterning, which increases CD imbalance and results in poor yield. Trim and deposition NU may be characterized as radial NU and azimuthal NU. A challenge in multi-patterning processing is minimizing and/or controlling within wafer (WiW) and wafer-to-wafer (WTW) variability of critical dimension NU and imbalance. The main causes of WiW and WTW critical dimension NU are lithography and ALD steps performed during multi-patterning processes.

Examples set forth herein include radial and azimuthal tuning via thermal modulation of trim and deposition temperature profiles to minimize resulting critical dimension NU and imbalance in multi-patterning processes while improving yield. The examples include controlling temperatures across a substrate during trim and deposition steps to match target temperature profiles while satisfying trim and deposition profiles. This includes minimizing radial and azimuthal NU. Process control methods are provided to enable feedforward and feedback critical dimension control.

Referring now to FIG. 1, an example of a substrate processing system 100 including one or more substrate supports (one substrate support 104 is shown), such as ALD pedestals, according to the present disclosure is shown. The substrate support 104 is arranged within a processing chamber 108. Each of the substrate supports may be structured and be operated similar to the substrate support 104. A substrate 112 is arranged on the substrate support 104 during processing.

A gas delivery system 120 includes gas sources 122-1, 122-2, . . . , and 122-N (collectively gas sources 122) that are connected to valves 124-1, 124-2, . . . , and 124-N (collectively valves 124) and mass flow controllers 126-1, 126-2, . . . , and 126-N (collectively MFCs 126). The MFCs 126 control flow of gases from the gas sources 122 to a manifold 128 where the gases mix. An output of the manifold 128 is supplied to a gas distribution device such as a multi-injector showerhead 140.

The substrate processing system 100 includes a temperature control system 150 for controlling temperatures of the substrate support 104 and as a result temperatures of the substrate 112. The temperature control system 100 includes temperature control elements (e.g., resistive heaters) 160, a temperature detector 161 and a temperature controller 162. The temperature controller 162 controls temperatures of the substrate support 104 during at least trim and deposition steps. This may be based on temperatures across the substrate 112 as detected by the temperature detector (e.g., an infrared camera) 161.

The substrate support 104 may include coolant channels 164. Cooling fluid is supplied to the coolant channels 164 from a fluid storage 168 and a pump 170. A valve 178 and a pump 180 may be used to evacuate reactants from the processing chamber 108 and/or to control pressure within the processing chamber 108.

The substrate processing system 100 includes controllers 182, such as the temperature controller 162. The controllers 182 control gas delivery from the gas delivery system 120. The controllers 182 control pressure in the processing chamber and/or evacuation of reactants using the valve 178 and the pump 180. The temperature controller 162 controls the temperature of the substrate support 104 and the substrate 112 based upon temperature feedback from the temperature detector 161 and/or other temperature sensors, which may be in the substrate support. Temperature sensors may be included for measuring temperatures of the coolant circulating through the coolant channels 164.

A robot 190 may be used to deliver substrates onto, and remove substrates from, the substrate support 104 and/or other substrate support of a corresponding process chamber. For example, the robot 190 may transfer substrates between the substrate support 104 and/or other substrate supports and a load lock 192. Any of the controllers 182 may control the robot 190 for loading and unloading substrates to and from the substrate supports.

Referring now to FIGS. 2A-2K, an example SADP process is described. FIG. 2A shows a substrate 200 including, for example, a hardmask layer 204 formed thereon. For example only, the substrate 200 includes a silicon (Si) substrate and the hardmask layer 204 is made of a silicon nitride ($Si_XN_Y$), where X and Y are integers, although other materials may be used. A plurality of core layers (e.g., mandrel layers) 208, 212, and 216 are deposited on the hardmask layer 204 (e.g., using chemical vapor deposition, or CVD). The materials of the core layers 208, 212, and 216 may be the same or different. Two or more of the core layers 208, 212 and 216 may be formed of the same one or more materials. One or more of the core layers 208, 212 and 216 may be formed of one or more different materials than the other one or more of the core layers 208, 212, and 216. For example only, the core layers 208, 212, and 216 may include amorphous silicon (a-Si). In some examples, the core layers 208, 212, and 216 may have a height of approximately 50-150 nm (e.g., 100 nm). A patterning layer (e.g., a patterned photoresist layer or mask) 220 is formed on the core layer 216 and patterned using photolithography.

Figure 2B:
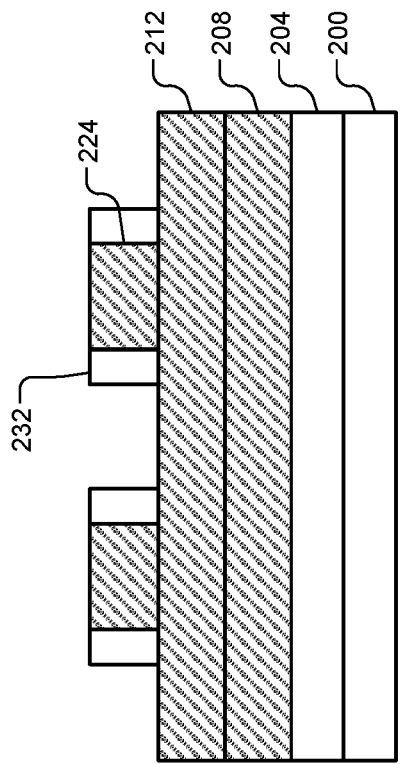

The substrate 200 including the hardmask layer 204, the core layers 208, 212, and 216, and the mask 220 is arranged within a processing chamber (e.g., an inductively coupled plasma chamber of an etch tool). As shown in FIG. 2B, the core layer 216 is etched (e.g., using an anisotropic etch or other process) to form mandrels 224. The mask 220 protects the portions of the core layer 216 corresponding to the mandrels 224 during the etching of the core layer 216. If the mask 220 is a photoresist mask, the mask 220 may be removed with an oxygen containing plasma. If the mask 220 is made of a material similar to a spacer layer 228 as described below, the mask 220 may remain on the mandrels 224 and may be etched during the etching of the spacer layer 228.

Figure 2C:
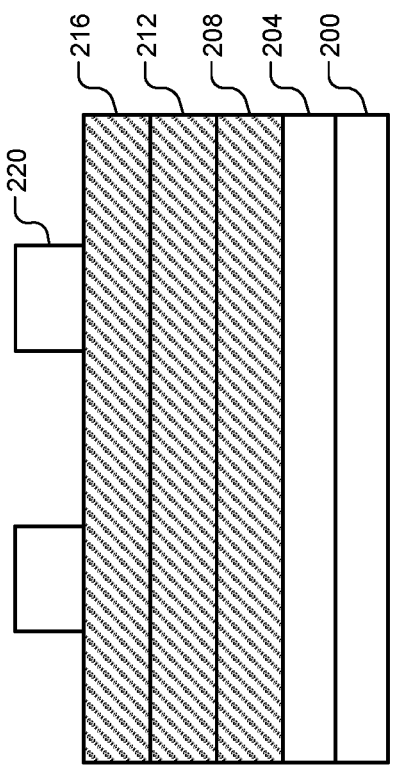

In FIG. 2C, the spacer layer 228 is deposited over the substrate 200 (i.e., on the core layer 212 and the mandrels 224). For example only, the spacer layer 228 may be conformally deposited using ALD, such as an oxide-type deposition (for example using precursors including silicon tetrachloride ($SiCl_4$), silane ($SiH_4$), etc.), a nitride-type deposition (using precursors including molecular nitrogen, ammonia ($NH_3$), etc.), and/or a carbon based deposition (using precursors including methane ($CH_4$), fluoromethane ($CH_3F$), etc.).

In one example, the spacer layer 228 is deposited using a $SiCl_4$ precursor in the presence of $O_2$. Other example process parameters for performing the deposition of the spacer layer 228 include temperature variation between a minimum temperature less than 10° C. up to 120° C., plasma power between 200 and 1800 W, a bias voltage from 0 to approximately 1000 volts, and a chamber pressure between 2 mTorr to 2000 mTorr.

In some examples, a trim step may be performed on the mandrels 224 prior to depositing the spacer layer 228. For example, in the trim step, the mandrels 224 may be etched to adjust widths of the mandrels 224 and dimensions of the spacer layer 228.

Figure 2D:
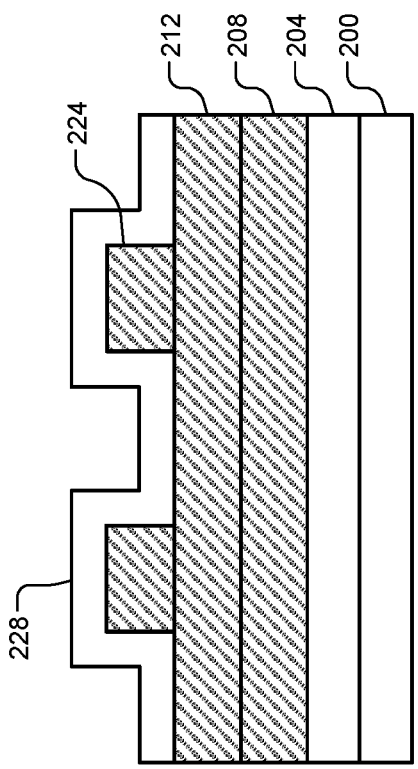
Figure 2E:
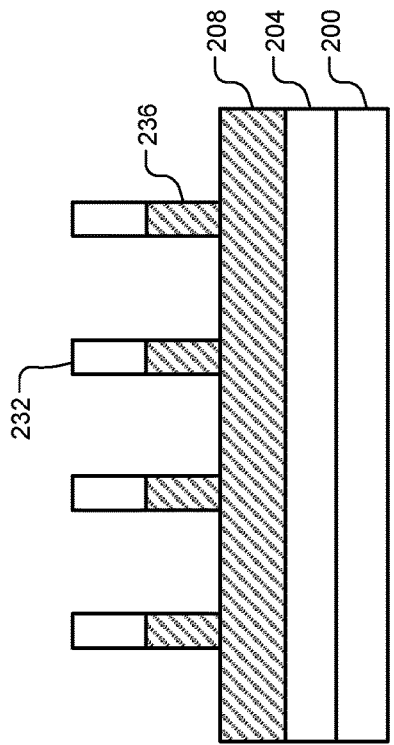

In FIG. 2D, the spacer layer 228 is etched (e.g., using an anisotropic etch process) to remove portions of the spacer layer 228 from the upper surfaces of the core layer 212 and the mandrels 224 while allowing sidewall portions 232 of the spacer layer 228 to remain. In some examples, a breakthrough step may be performed (e.g., a fluoride containing plasma treatment) subsequent to the etch described in FIG. 2D. Further, depending on the material of the spacer layer 228, an oxygen-containing plasma treatment may be performed prior to the fluoride containing plasma treatment. In FIG. 2E, the mandrels 224 are removed (e.g., using an anisotropic etch). Accordingly, the sidewall portions 232 remain formed on the substrate 200.

Figure 2F:
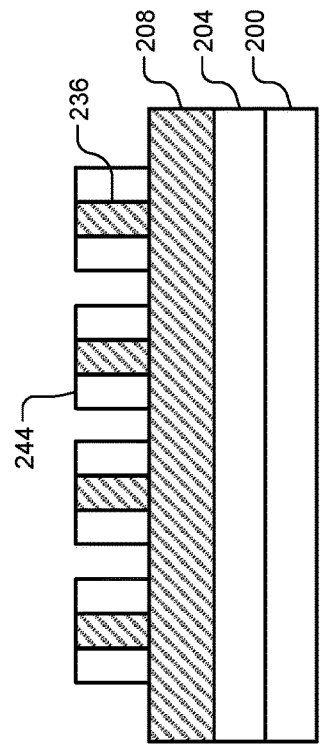

As shown in FIG. 2F, the core layer 212 is etched (e.g., using an anisotropic etch or other process) to form mandrels 236. The sidewall portions 232 act as a mask to protect the portions of the core layer 212 corresponding to the mandrels 236 during the etching of the core layer 212. The sidewall portions 232 can be removed in an additional plasma etching step, during the etching of a spacer layer 240 as described below, etc.

Figure 2G:
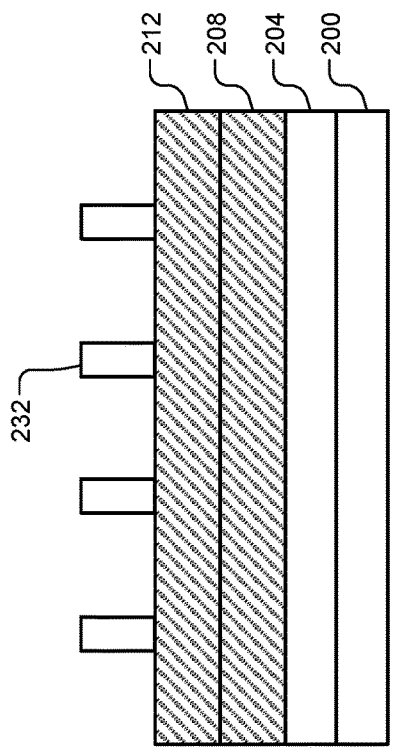

In FIG. 2G, the spacer layer 240 is deposited over the substrate 200 (i.e., on the core layer 208 and the mandrels 236). For example only, the spacer layer 240 may be conformally deposited using ALD in a manner similar to the spacer layer 228. In some examples, a trim step may be performed on the mandrels 236 prior to depositing the spacer layer 240.

Figure 2H:
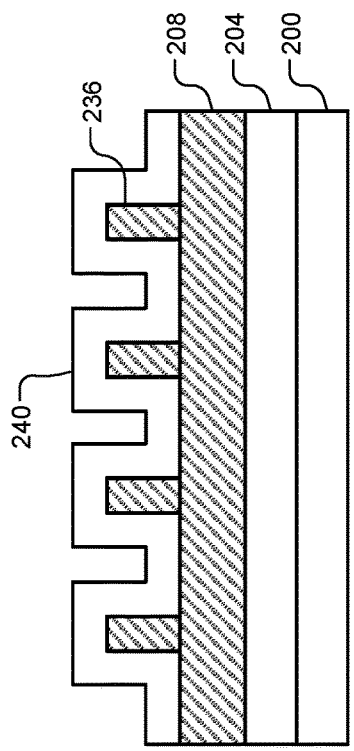

In FIG. 2H, the spacer layer 240 is etched (e.g., using an anisotropic etch process) to remove portions of the spacer layer 240 from the upper surfaces of the core layer 208 and the mandrels 236 while allowing sidewall portions 244 of the spacer layer 240 to remain. In some examples, a breakthrough step may be performed (e.g., a fluoride containing plasma treatment) subsequent to the etching described in FIG. 2H. Further, depending on the material of the spacer layer 240, an oxygen-containing plasma treatment may be performed prior to the fluoride containing plasma treatment. In FIG. 2I, the mandrels 236 are removed (e.g., using an anisotropic etch). Accordingly, the sidewall portions 244 remain formed on the substrate 200.

Figure 2J:
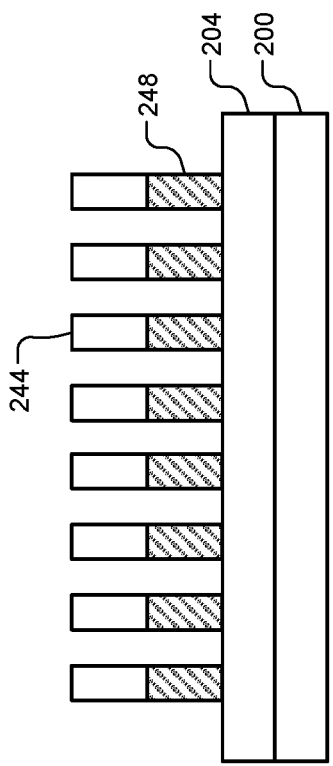
Figure 2I:
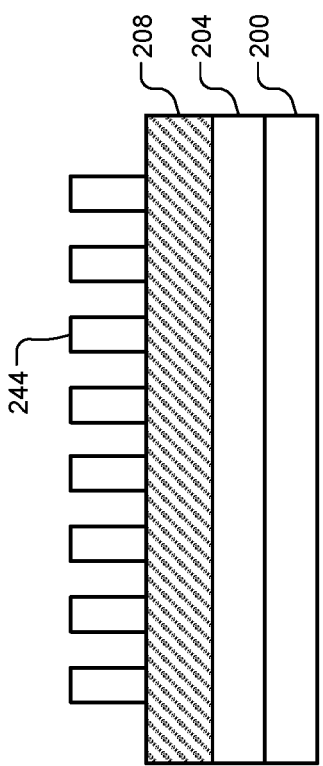

As shown in FIG. 2J, the core layer 208 is etched (e.g., using an anisotropic etch or other process) to form a plurality of mandrels 248. The sidewall portions 244 act as a mask to protect the portions of the core layer 208 corresponding to the mandrels 248 during the etching of the core layer 208. The sidewall portions 244 can be removed in, for example, an additional plasma etching step as shown in FIG. 2K.

Figure 2K:
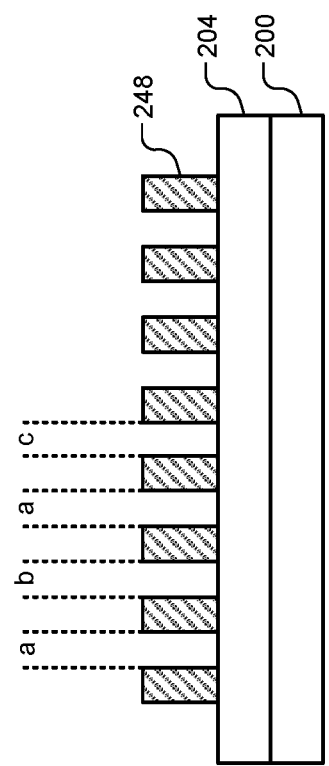

As shown in FIG. 2K, the SADP process results in the mandrels 248 formed on the substrate 200 (e.g., on the hardmask layer 204) in a spaced pattern. A spacing between the mandrels 248 is determined in accordance with a spacing between the sidewall portions 244 as shown in FIG. 2I, which is in turn determined in accordance with a spacing between the sidewall portions 232 as shown in FIG. 2E. Widths of the mandrels 236 and the sidewall portions 232 determine the respective spacing between the sidewall portions 244 and the sidewall portions 232 and, therefore, the spacing between the mandrels 248. Accordingly, the trim steps may be performed on the mandrels 232 and the mandrels 236 to ensure uniform spacing between the mandrels 248. For example, respective widths of the mandrels 232 and the mandrels 236 may be trimmed to achieve a uniform spacing such that a=b=c as shown in FIG. 2K.

Figure 3A:
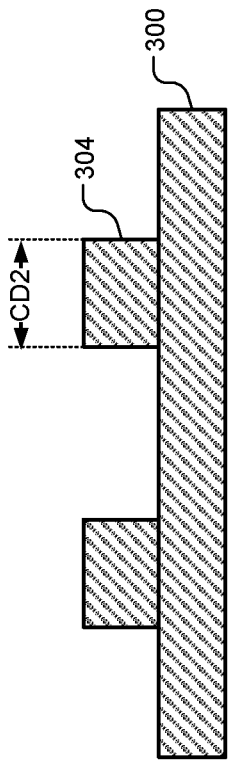
FIGS. 3A through 3D illustrate an example trim step of a self-aligned double patterning process.
Figure 3B:
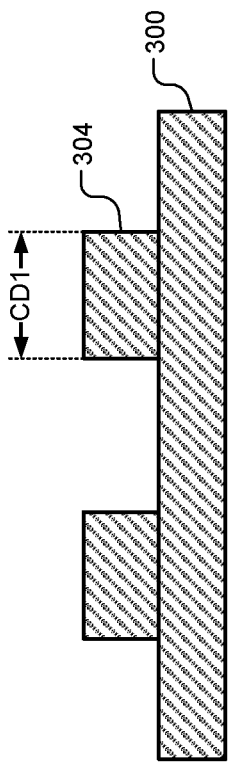
Figure 3C:
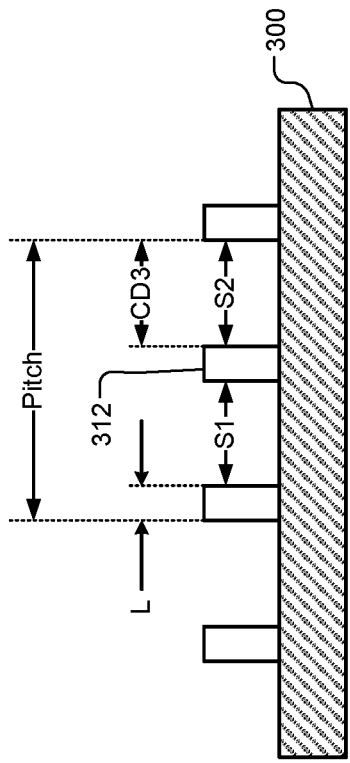

Referring now to FIGS. 3A, 3B, 3C, and 3D, an example trim step of an SADP process is described. For simplicity, only a single core layer 300 and mandrels 304 are shown. In FIG. 3A, the mandrels 304 are shown prior to a trim step (e.g., subsequent to an etching step to form the mandrels 304 on the core layer 300, such as shown in FIG. 2B). A width of the mandrels 304 corresponds to a critical dimension CD1. The mandrels 304 are trimmed (e.g., etched) as shown in FIG. 3B to adjust the width of the mandrels 304. Accordingly, the critical dimension of the mandrels 304 is reduced to CD2. In FIG. 3C, a spacer layer 308 is deposited (e.g., conformally deposited using ALD as described above) over the core layer 300 and the mandrels 304. Plasma can attack photoresist at beginning of deposition of the spacer layer 308 and as a result further reduce the size and/or width of the mandrels 304, such that the critical dimension of the mandrels 304 is reduced to CD3.

Figure 3D:
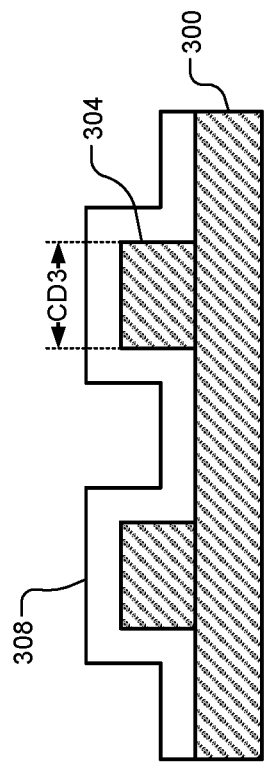

FIG. 3D shows sidewall portions 312 of the spacer layer 308 remaining on the core layer 300 subsequent to performing one or more etch steps to remove portions of the spacer layer 308 and the mandrels 304. Spaces (e.g., S1, S2, etc.) between the sidewall portions 312 correspond to respective widths (e.g., CD3) of the mandrels 304. Accordingly, a pitch of the sidewall portions 312 may be defined as S1+S2+2L, where L corresponds to a line width (i.e., a width of one of the sidewall portions 312).

Various non-uniformities affect an amount of material deposited (e.g., during ALD steps) and removed (e.g., during etching steps) during processing. For example, etching non-uniformities associated with the trim step include radial non-uniformities and azimuthal non-uniformities. Radial non-uniformities correspond to differences in etch amounts as a radial distance from a center of a substrate increases. Conversely, azimuthal non-uniformities correspond to differences in etch amounts in an angular direction around the substrate. FIG. 4 shows example radial and azimuthal non-uniformities in etch amounts on a surface of a substrate 400. In FIG. 4, different areas 401, 403, 405, 407 and 409 are shown that may have different etch amounts. The areas 401, 403, 405, 407 and 409 are shown as examples and may have different shapes and/or sizes. A different number of areas may be included than shown. Also, for each of the areas 401, 403, 405, 407 and 409, the etch amounts may be the same across the area or may vary. As an example, the etch amounts (i.e., an amount etched from the surface of the substrate 400) may range from 160 Angstroms (Å) to 175 Å, or a range of 15 Å. As shown by radial line 404 in an example radial direction, the etch amount may range from 165 Å in a center region 408 of the substrate 400 to 170 Å at an edge 412 of the substrate 400. Conversely, as shown by arc 416 in an example azimuthal direction, the etch amount may range from 170 Å to 160 Å along the edge 412.

Various methods may be used to tune the radial non-uniformities, including, but not limited to, injecting edge tuning gases, adjusting edge ring height, controlling temperatures across the substrate 400, adjusting pressures, etc.

Figure 5:
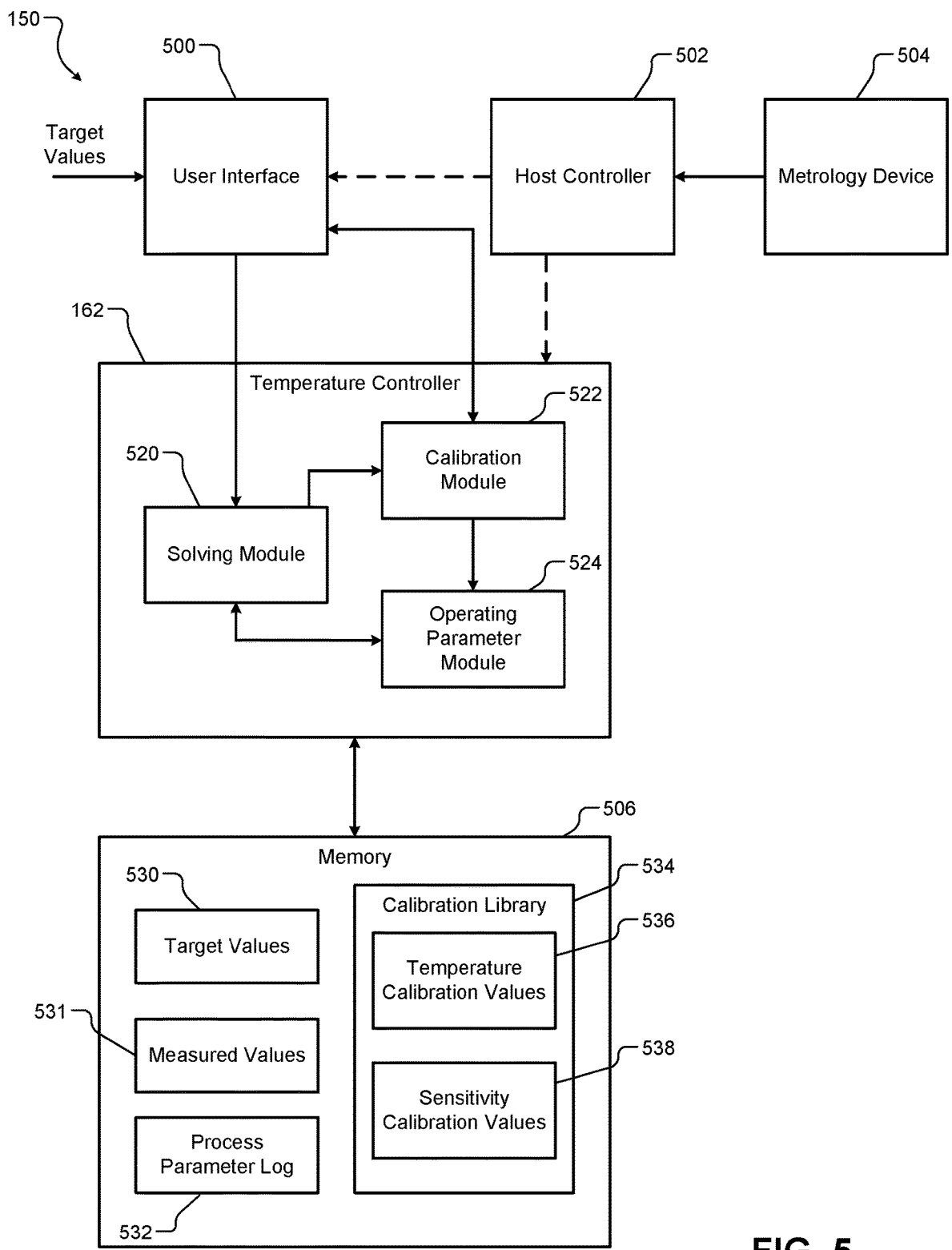
FIG. 5 is a function block diagram of the temperature control system of FIG. 1.

FIG. 5 shows the temperature control system 150. The temperature control system includes the temperature controller 162, a user interface 500, a host controller 502, a metrology device 504 and a memory 506. The temperature controller 162 includes a solving module 520, a calibration (or pre-solver) module 522 and an operating parameter (or solver) module 524. In one embodiment, the modules 520, 522 and 524 are implemented software algorithms executed by the temperature controller 162. In another embodiment, each of the modules 520, 522, 524 are implemented as separate processors. In another embodiment, one or more of the modules 520, 522, 524 are implemented by one or more processors separate from the temperature controller 162. The memory 506 may store target values 530, measured values 531, a process parameter log 532, and a calibration (or pre-solver) library 534 including temperature calibration values 536 and sensitivity calibration values 538.

The user interface 500 may include a touchscreen, a keyboard, a mouse, and/or other user input device. The user interface 500 may enable communication between the host controller 502, a user and the temperature controller 162 and/or one or more of the modules 520, 522, 524. The user interface 500 may receive target input values including target temperatures, critical dimensions, deposition values, trim values, temperature profiles, critical dimension profiles, deposition profiles, trim profiles, pressures, materials, compositions, recipes, timing values, etc. The profiles may refer to profiles of substrate support and/or a substrate. Each of the profiles may refer to values for a predetermined number of points and/or zones across a surface of a substrate support or substrate. For example, a temperature profile of a substrate support may include temperature values for a predetermined number of points and/or zones across a surface of a substrate support opposing a substrate. Each of the profiles may be provided for a certain operation and time period of a process being performed. For example, a deposition profile may include amounts of deposition (or thickness of a layer of material being deposited) for a predetermined number of points and/or zones across a substrate during deposition of a layer (e.g., a spacer layer).

The host controller 502 may collect and/or be used to measure process sensitivity results. The metrology device 504 may include, for example, a spectrometer, a scanning electron microscopy (SEM) device, an optical metrology machine, and/or other measuring devices. The metrology device 504 may be used to measure, for example, critical dimensions of a substrate subsequent to performing a trim or deposition step. The measured values may be provided as inputs via the user interface 500 to the temperature controller 162 or may be provided directly to the temperature controller 162. The temperature controller 162 may store the target values and measured values in the memory 506 as the target values 530 and measured values 531. The host controller 502 may change radial set points during below described temperature profile targeting and substrate profile targeting modes.

Figure 22:
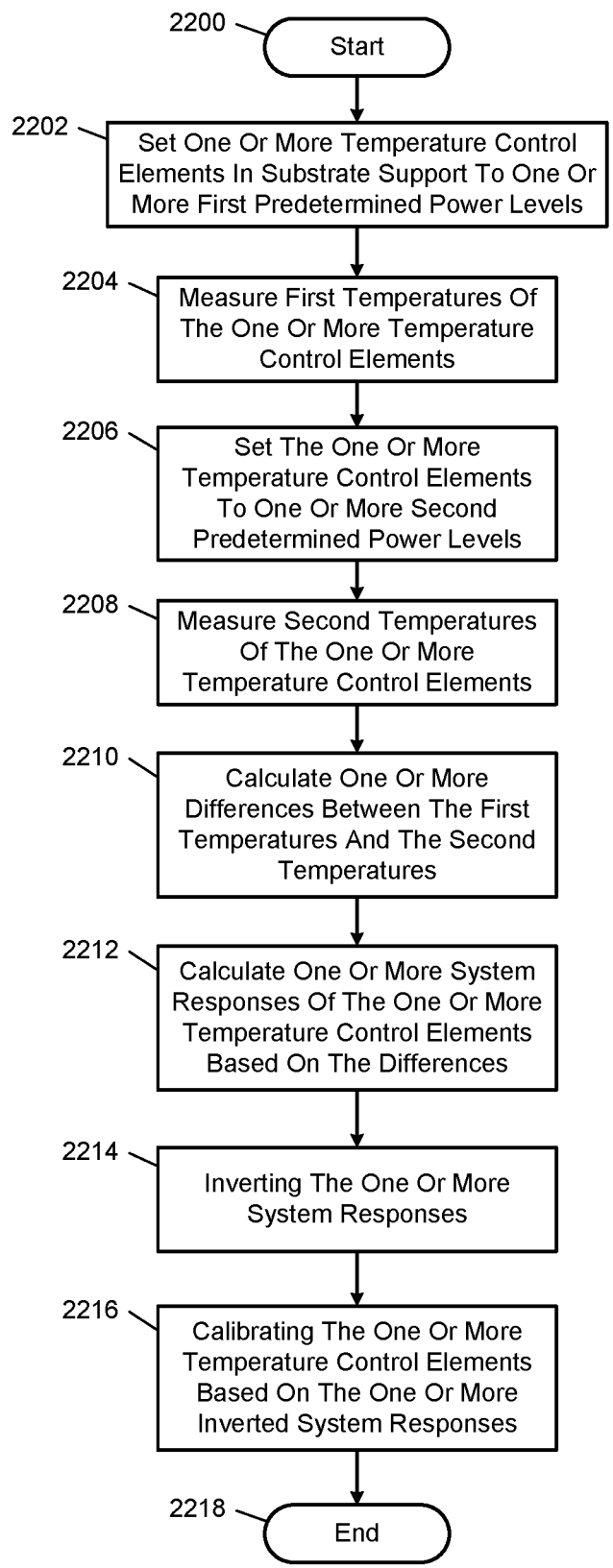
FIG. 22 illustrates a temperature calibration method for a substrate support.
Figure 23:
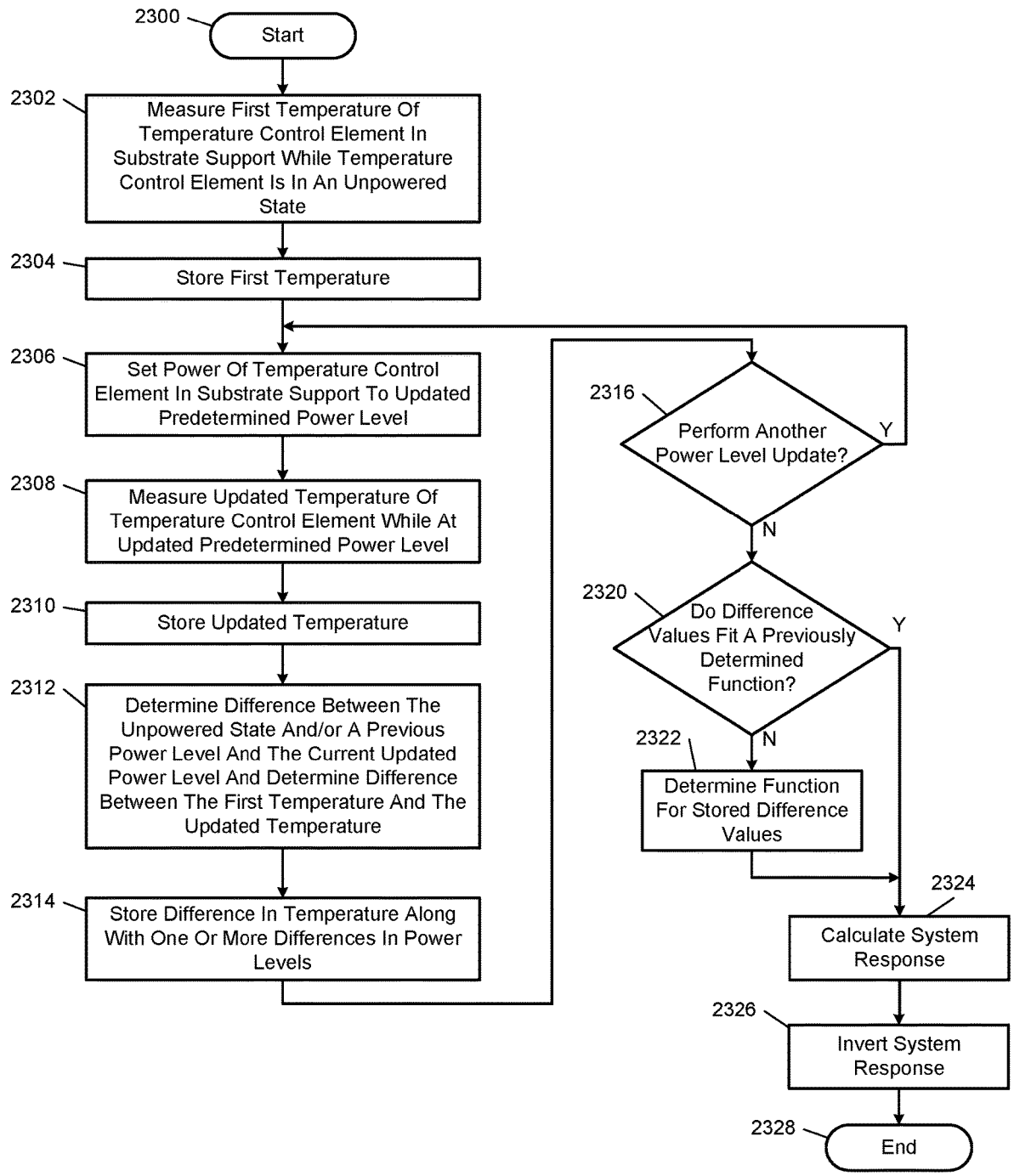
FIG. 23 illustrates another temperature calibration method for a substrate support.

The solving module 520 and/or the calibration module 522 may perform a temperature calibration process to determine the temperature calibration values 536 (or temperature matrix, also referred to as an A-matrix). The temperature calibration values may refer to differences in temperatures relative to differences in duty cycles, power levels, current levels, and/or voltages of temperature control elements (TCEs). The temperature calibration values may refer to rates of change in temperature for a given change in duty cycles, power levels, current levels, and/or voltages. The temperature calibration values may include calibrated temperatures corresponding to set duty cycles, power levels, current levels, and/or voltages of TCEs. Example methods for determining the temperature calibration values are shown in FIGS. 22-23. The temperature calibration process may be performed based on the target values 530, which may be received from the user interface 500 and/or the memory 506.

The calibration module 522 may collect input values, measured values and values characterizing a current process chamber, a substrate support, a substrate, and process conditions. This may include receiving the target values and measured values from the user interface 500 and/or the memory 506. The calibration module 522 may determine the sensitivity calibration values 538 and/or profiles for trim and deposition. A trim sensitivity calibration value may refer to an amount of trimming (or decrease in critical dimension) for a set temperature or a change in temperature. A deposition sensitivity calibration value may refer to an amount of deposition (or increase in critical dimension) for a set temperature or change in temperature. Example methods are described with respect to FIGS. 11 and 12 for determining these sensitivity calibration values 538, which may be stored as matrices in the memory 506. The sensitivity calibration values 538 may be provided to the user interface 500, the operating parameter module 524 and/or the solving module 520. The calibration module 522 performs calculations to convert target critical dimension values and/or substrate profile values to trim and deposition values and use the sensitivity calibration values (or sensitivity matrix, also referred to as a S-matrix) to generate target set points. The target set points may refer to set points for specific points and/or zones of one or more substrate supports. The target set points may refer to target temperatures and/or corresponding duty cycles, power levels, current levels, and/or voltages of TCEs.

During calibration, the operating parameter module 524 determines process operating parameters to achieve temperatures to determine the temperature calibration values 536 and the sensitivity calibration values 538. The operating parameter module 524 implements an algorithm to convert user inputs to hardware inputs while accounting for hardware sensitivity. Subsequent to calibration and during processing of subsequent substrates, the operating parameter module 524 determines process operating parameters to achieve target parameters. The operating parameters may be stored as the process parameter log 532. This may include, for example, determining duty cycle, power level, current level, and/or voltages settings for TCEs 160 of FIG. 1 for achieving target temperatures across the substrate support and substrate being processed. The operating parameters may be determined based on the target values, the measured values, the temperature calibration values and/or the sensitivity calibration values.

During calibration, the solving module 520 sets and adjusts, for example, power levels, current levels, and/or voltages of TCEs to determine the temperature calibration values 536 and the sensitivity calibration values 538. Subsequent to calibration and during processing of subsequent substrates, the solving module 520 processes substrates based on the target values 530, the temperature calibration values 536, the sensitivity calibration values 538, and the process parameter log 532. This includes setting duty cycles, power levels, current levels, and/or voltages of TCEs during trim and deposition steps to provide targeted critical dimensions for each of these steps. As an example, the solving module 520 may have multiple channels for each substrate support being controlled, which supply set amounts of power to each of the channels for predetermined periods of time. The solving module 520 may receive the target values 530 and/or the measured values 531 from the user interface 500 and/or the memory 506.

The temperature controller 162 and/or the solving module 520 may operate in a temperature profile targeting mode or a substrate profile targeting mode. While in the temperature profile targeting mode, operating parameters are controlled such that temperatures of a substrate match or are within predetermined ranges of target temperatures of a target temperature profile. Temperature profile targeting includes use of known temperature sensitivities for points and/or zones of a substrate support and substrate. The temperature sensitivities refer to changes in a parameter of interest (e.g., a critical dimension) and temperature. While in the temperature profile targeting mode, a user may enter via the user interface 500 radial set point temperatures to target. The temperature controller 162 may then adjust parameters of TCEs based on the radial set point temperatures, temperature sensitivity values (e.g., critical dimension in Å/° C.), temperature calibration values from previous cycles and/or calculations, and azimuthal correction factors. The parameters of the TCEs may include duty cycle, power, current, voltage, and/or other TCE parameter.

The solving module 520 may perform open loop and/or closed loop control of each temperature controlled zone and/or one or more TCEs. The temperature controlled zones and/or the TCEs may be implemented in an open loop or a closed loop.

During the substrate profile targeting mode, a target trim profile and/or a target deposition profile is used to provide targeted critical dimension values. Substrate profile targeting includes the use of the calibration module 522 to aid in target trim, deposition and associated temperature set points. This may be used for trim and/or deposition in multiple axes implementations. During the substrate profile targeting mode, a user may enter or select a target trim profile, deposition profile, and/or combined trim and deposition profile. The user may further input or select ADI, ASD and ACE values to target. The temperature controller 162 may adjust parameters of TCEs based on: the one or more profiles; the ADI value; the ASD value; the ACE value; previously determined trim sensitivity and/or calibration values; and/or deposition sensitivity and/or calibration values.

Figure 6:
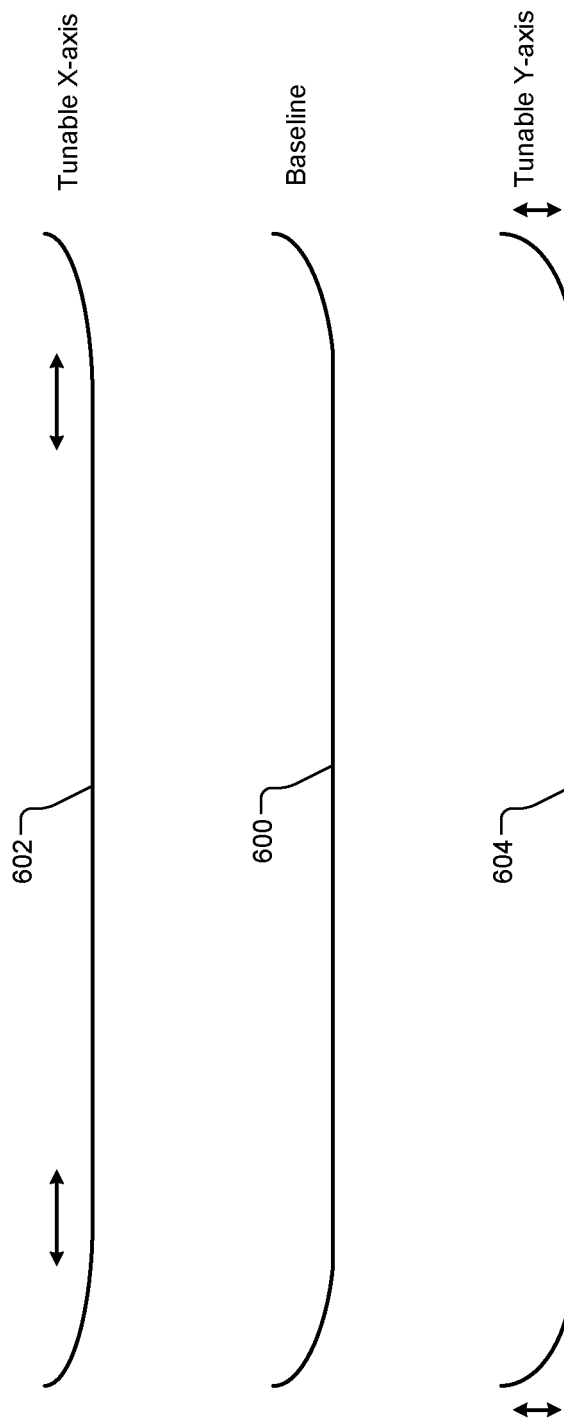
FIG. 6 is an example tuning diagram including tuning plots illustrating X-axis and Y-axis tuning in accordance with an embodiment of the present disclosure.

FIG. 6 shows a tuning diagram including tuning plots illustrating X-axis and Y-axis tuning. A baseline plot 600 is shown. The tuning disclosed herein for trim and deposition steps is performed to adjust trim and deposition amounts in both x and y axes, as illustrated respectively by plots 602 and 604. The amount of etching during a trim step and/or the amount of material deposited during a deposition step may increase radially, such that near an edge of a substrate, an increased amount of etching and deposition occurs.

Figure 7B:
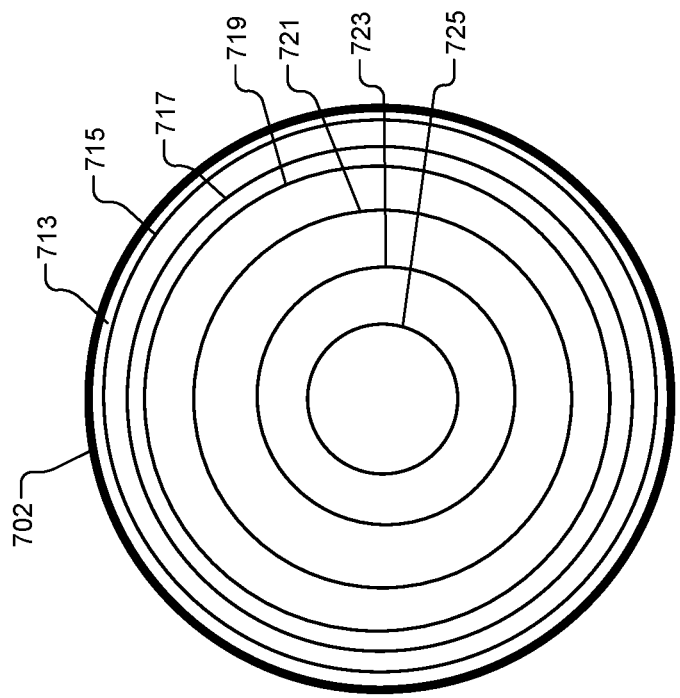
FIG. 7B is an example target temperature profile of a substrate in accordance with an embodiment of the present disclosure.
Figure 7A:
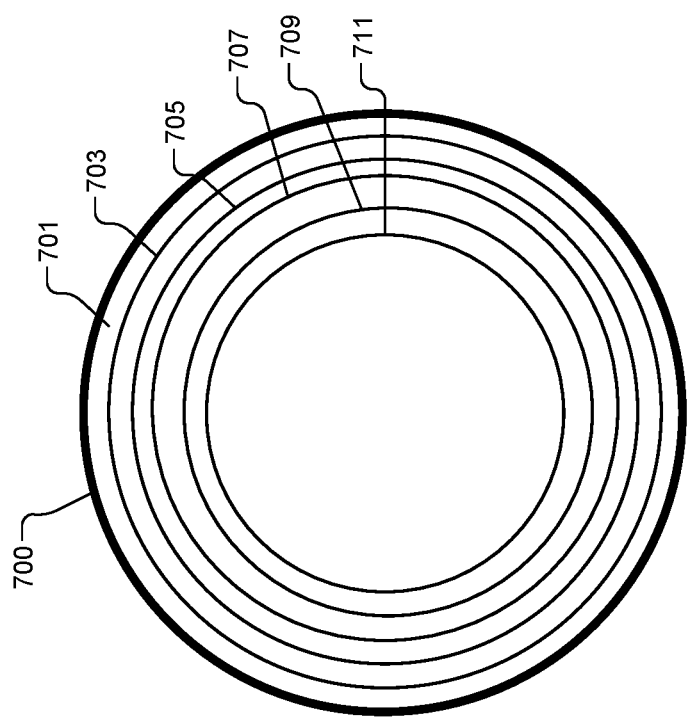
FIG. 7A is an example target thickness profile of a substrate in accordance with an embodiment of the present disclosure.

FIG. 7A shows an example target thickness profile 700 of a substrate. The target profile may be a trim profile, a deposition profile, or a combination trim and deposition profile. The target profile may include, for example, target critical dimensions for different radial distances from a center of the substrate. FIG. 7A shows different areas 701, 703, 705, 707, 709 and 711, which may have different target thicknesses. A different number of areas may be included than shown. The areas 701, 73, 705, 707, 709 and 711 are shown as examples and may have different shapes and/or sizes. The thicknesses in each of the areas 701, 703, 705, 707, 709 and 711 may be the same across that area or may vary.

FIG. 7B shows an example target temperature profile 702 of a substrate. The target temperature profile includes target temperatures for different radial distances from a center of the substrate. FIG. 7B shows different areas 713, 715, 717, 719, 721, 723 and 725, which may have different target temperatures. A different number of areas may be included than shown. The areas 713, 715, 717, 719, 721, 723 and 725 are shown as examples and may have different shapes and/or sizes. The target temperatures for each of the areas 713, 715, 717, 719, 721, 723 and 725 may be the same across that area or may vary.

Figure 8:
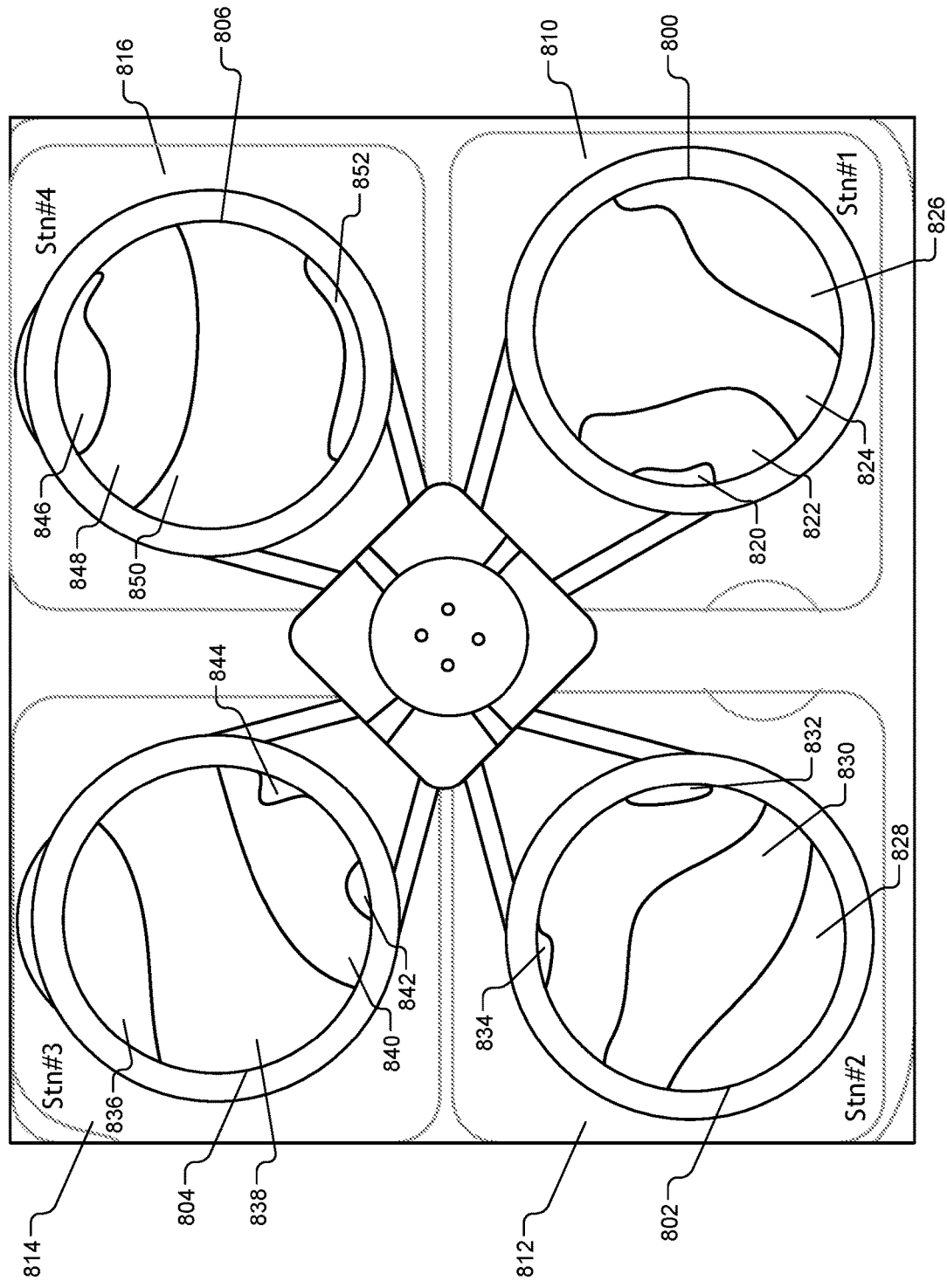
FIG. 8 illustrates example correction temperature profiles of substrates in respective stations illustrating on-tool artifacts during trim and deposition.

FIG. 8 shows correction temperature profiles 800, 802, 804, 806 of substrates in respective stations 810, 812, 814, 816 illustrating on-tool artifacts during trim and deposition. The correction temperature profiles 800, 802, 804, 806 illustrate that certain areas of a substrate are heated more than others to provide radial and azimuthal corrections. The disclosed systems and methods described herein perform temperature corrections to minimize radial and azimuthal non-uniformities. Radial tuning allows for profile tuning, whereas azimuthal tuning allows for rectification of on-tool artifacts.

Each of correction temperature profiles 800, 802, 804, 806 have corresponding areas 820, 822, 824, 826, 828, 830, 832, 834, 836, 838, 840, 842, 844, 848, 850 and 852, which may have different temperatures. A different number of areas may be included than shown. The areas 820, 822, 824, 826, 828, 830, 832, 834, 836, 838, 840, 842, 844, 848, 850 and 852 are shown as examples and may have different shapes and/or sizes. The temperatures in each of the areas 820, 822, 824, 826, 828, 830, 832, 834, 836, 838, 840, 842, 844, 848, 850 and 852 may be the same across that area or may vary.

Figure 9:
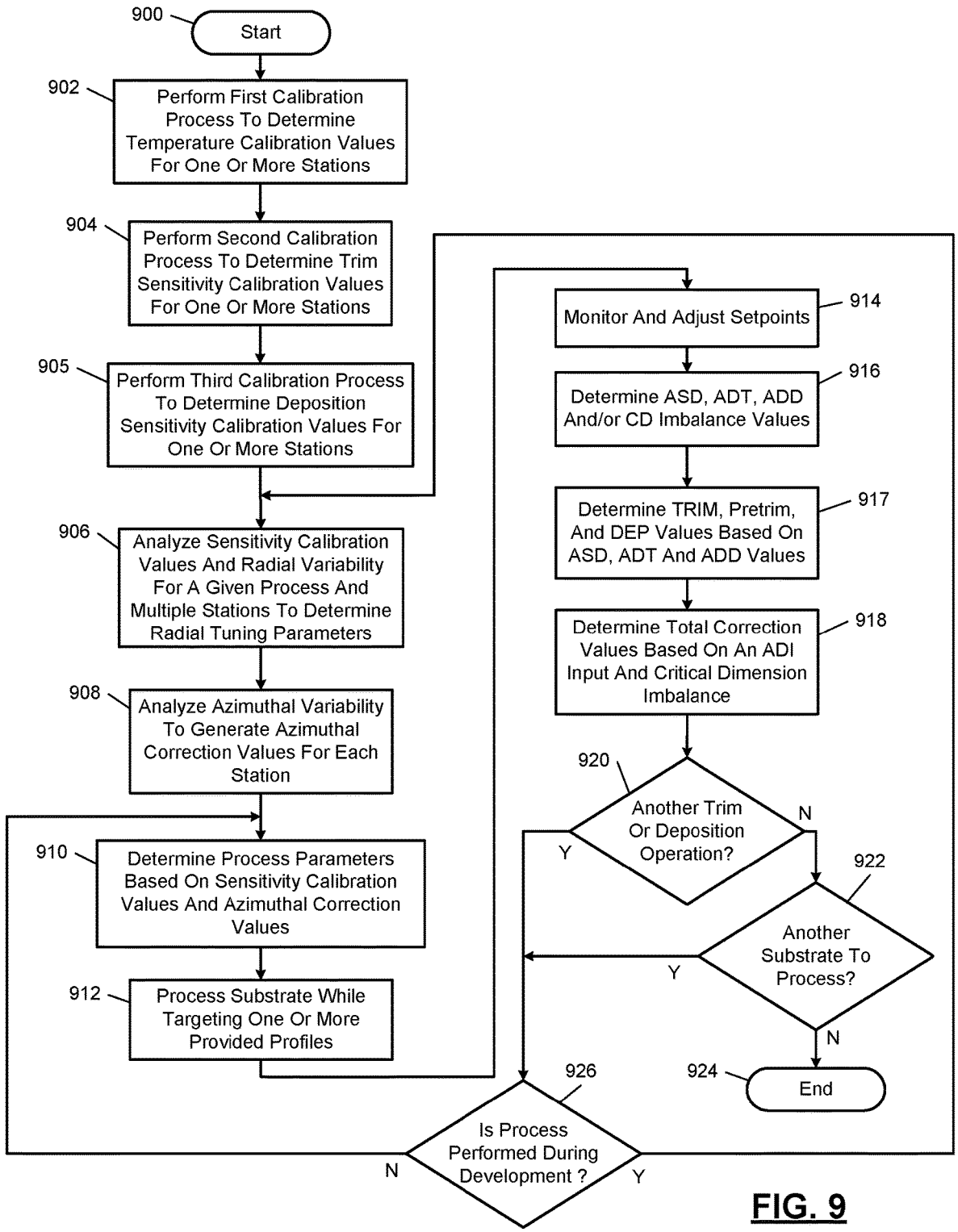
FIG. 9 illustrates a trim and deposition control method in accordance with an embodiment of the present disclosure.

FIG. 9 shows a trim and deposition control method. The method of FIG. 9 is a data flow process by which sensitivity calibration values of deposition and trim and temperature calibration values are used for controlling critical dimensions. The sensitivities are determined and the critical dimensions are controlled for a first set of substrates to provide inputs (or predetermined values) for subsequent substrates being processed. Although the following operations are primarily described with respect to the implementations of FIGS. 1 and 5, the operations may be easily modified to apply to other implementations of the present disclosure. The operations may be iteratively performed.

Figure 11:
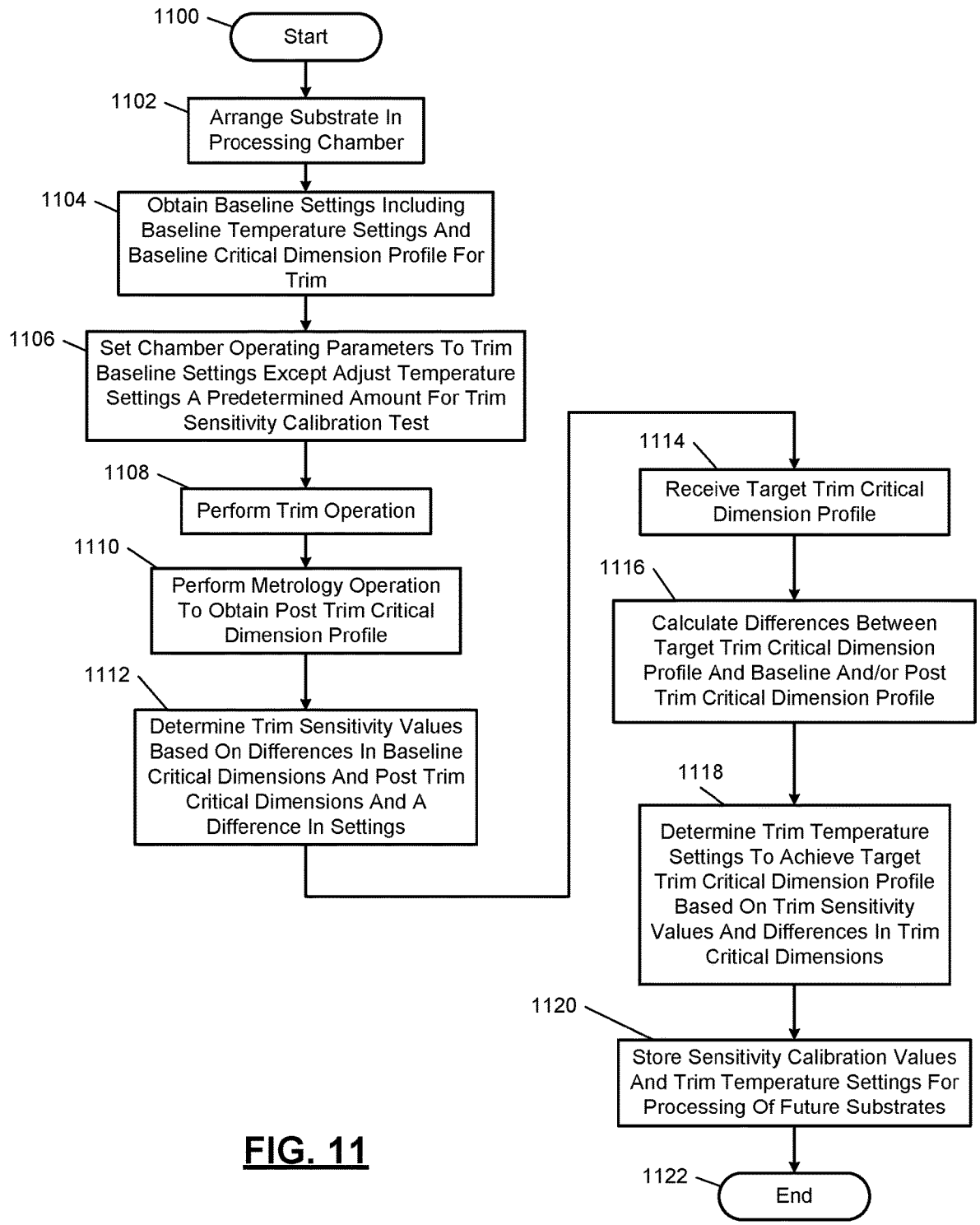
FIG. 11 illustrates a trim calibration method in accordance with an embodiment of the present disclosure.
Figure 12:
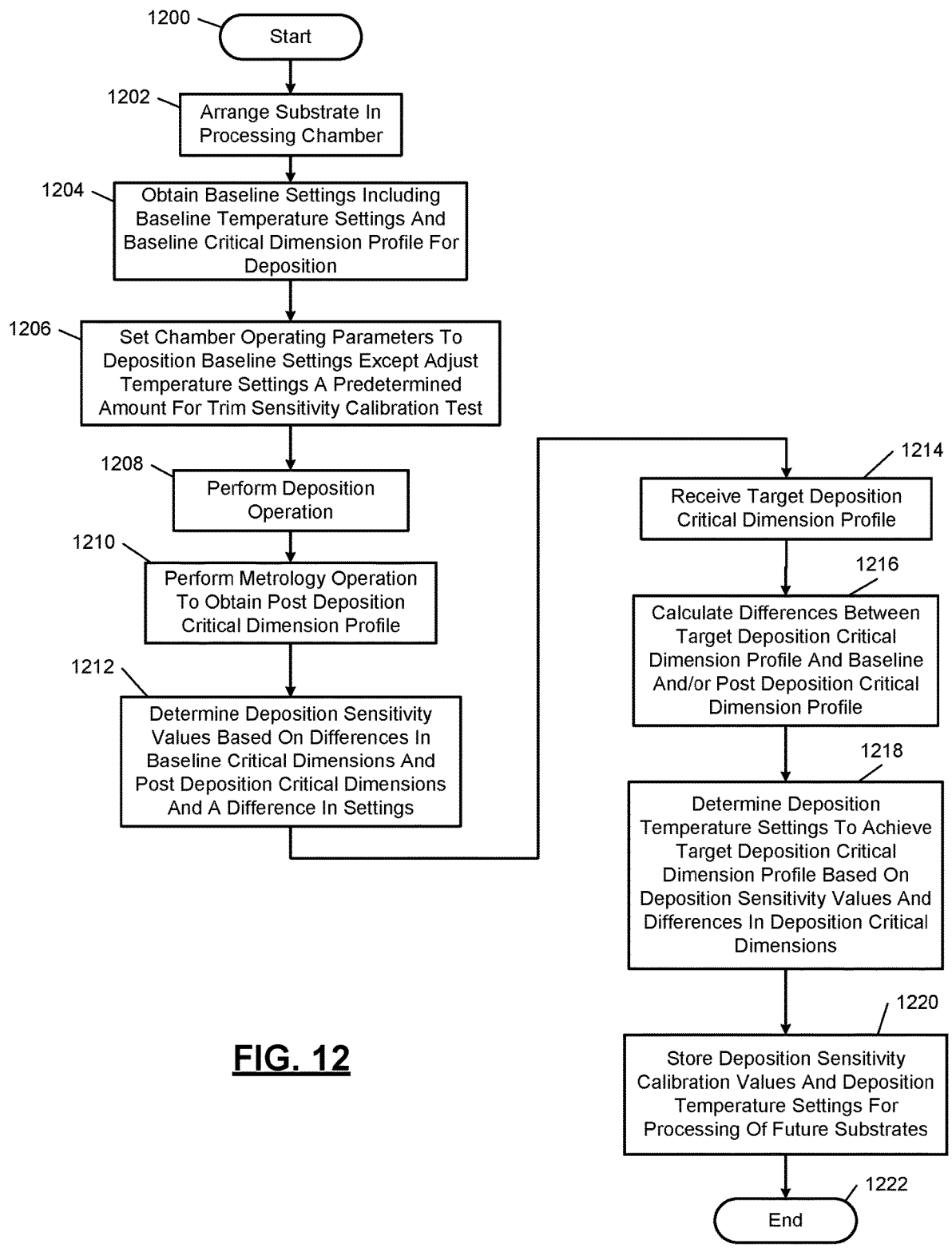
FIG. 12 illustrates a deposition calibration method in accordance with an embodiment of the present disclosure.

The method may begin at 900. At 902, a first calibration process is performed to determine temperature calibration values 536 for one or more stations. Examples of the first calibration process are shown and described with respect to FIGS. 22-25. At 904, a second calibration process is performed to determine trim sensitivity calibration values for one or more stations. An example of the second calibration process is shown in FIG. 11. At 905, a third calibration process is performed to determine deposition sensitivity calibration values for one or more stations. An example of the third calibration process is shown in FIG. 12. As another example, the trim and/or deposition sensitivity calibration values may be determined using the method of FIG. 27. The methods of FIGS. 11-12 may be modified to include the method of FIG. 27. Operations 902, 904 and 905 may be performed by the calibration module 522. During the calibration operations, thermocouple (TC) substrates may be used for detecting substrate temperatures. The determined calibration values and critical dimensions measured during the calibration processes may be stored in the memory 506 and used in subsequent operations. Although the second and third calibration process are described as separate processes for respectively calibrating trim and deposition steps, calibration and/or measurement values may be obtained subsequent to and as a result of performing a combination of trim and deposition steps. Operations 902, 904, 905 may be performed in the order shown, in a different order or in parallel.

As an alternative to performing the trim and deposition calibration processes at 904, 905, temperature profiles may be provided for trim and deposition steps to achieve target critical dimensions. The temperature profiles may be used at 912 and the operating parameter module 524 may determine the temperature settings for the TCEs based on the temperature profiles.

At 906, the operating parameter module 524 may analyze (i) the temperature calibration values, trim sensitivity calibration values, and deposition sensitivity calibration values, (ii) critical dimension, parameter and radial variability for a given process, and (iii) critical dimension, parameter and radial variability between stations to determine radial tuning parameters. This may include determining temperature settings and/or parameters of TCEs 160 for different radii of the substrate support and for each trim and deposition step performed at 912. The radial tuning parameters may be determined based on one or more total correction values determined at 918.

At 908, the temperature controller 162 analyzes azimuthal variability to generate azimuthal correction values for each station. This may include determining temperature setting adjustment values and/or parameter adjustment values for the TCEs. The analysis of azimuthal variability may be based on determined temperature values, the temperature calibration values, and/or the sensitivity calibration values for each trim and deposition step performed at 912.

At 910, the operating parameter module 524 determines process (or operating) parameters based on one or more target profiles, the temperature calibration values, the corresponding sensitivity calibration values for trim and/or deposition steps, the radial tuning parameters, and the azimuthal correction values. The memory 506 may store tables, equations, algorithms, and/or other items relating the operating parameters to the stated values and parameters, which are utilized by the operating parameter module 524. The one or more target profiles may include any of the target profiles disclosed herein, such as a temperature profile, a trim profile, a deposition profile, a critical dimension profile, etc.

At 912, the solving module 520 performs one or more process operations associated with processing a substrate while targeting one or more provided profiles, which may have been provided at 910. This may include performing a trim and/or a deposition operation. The processing of the substrate may occur over one or more iteration of operations 906, 908, 910, 912, 914, 916, 917, 918, 920, 926. The processing may include performing a multi-patterning process, such as that described above. At 914, the solving module 520 and/or operating parameter module 524 may monitor parameters of sensors and adjust set points of temperatures and/or TCE parameters.

At 916, the solving module 520 may obtain multiple values corresponding to critical dimensions of features of the substrate measured subsequent to one or more of the trim and/or deposition steps performed during operation 912. The values may have been previously measured and stored in memory, for example, during the calibration processes performed at 904, 905 and/or may be measured during development. One or more of the values may be predetermined inputted requirements. In one embodiment, the solving module 520 determines an after spacer deposition (ASD) value, an after develop trim (ADT) value, and an after carbon etch (ACE) value. The ASD value may be a critical dimension after trim and deposition steps, such as a sum of CD3 and a product of 2 and L (or CD3+2L), which is the width of the mandrel plus widths of left and right spacer sidewall portions shown in FIGS. 3C and 3D. The ADT value is the width of the mandrel after trimming or CD2. The ACE value may be a width of a mandrel after trimming and removal of a portion of the mandrel at the beginning of a deposition step including any overetching. Critical dimension imbalance values may also be determined. Critical dimension imbalance may refer to differences in critical dimensions of different features and/or mandrels of a same substrate. Critical dimension imbalance may also refer to differences between the same features of different substrates (or wafer-to-wafer) for a same station or of different stations.

At 917, the solving module 520 may calculate multiple values corresponding to the critical dimensions of the features of the substrate subsequent to one or more of the trim and/or deposition steps performed during operation 912. This may include calculating: an amount of etching (or width of material removed) TRIM on each side of a feature during a trim step, an amount of material (or width of material) Pretrim removed from each side of a mandrel at the beginning of a deposition step, an amount of material (or width of material) DEP deposited on each side of a mandrel during a deposition step. The TRIM, Pretrim and DEP values may be the unknown values that are determined based on the ASD, ADT and ACE values. This may be accomplished using, for example, equations 1-3, where ADI is an after develop inspection (ADI) value such as above-stated CD1 shown in FIG. 3A, and where OVRE is an amount of over etching. The OVRE value may be predetermined and/or estimated.

$$ASD = ADI - 2TRIM - 2Pretrim + 2DEP \quad (1)$$

$$ADT = ADI - 2TRIM \quad (2)$$

$$ACE = ADI - 2TRIM - 2Pretrim - OVRE \quad (3)$$

If there are 4 unknown values, then another equation may be used, such as equation 4, which relates an after spacer open (ASO) value to the ADI, TRIM and Pretrim values. By having a same number of equations as unknowns, a single unique solution is able to be determined for each set of know values provided.

$$ASO = ADI - 2TRIM - 2Pretrim \quad (4)$$

Other equations including S1, S2, L and pitch may also be used.

Pre-trimming (or parasitic trimming) may occur at a beginning of a deposition step when the substrate is exposed to a plasma. Features (e.g., mandrels) are further etched during pre-trimming. Trimming and pre-trimming tend to be more sensitive to temperature changes than deposition. For a given change in temperature, there can be an order of magnitude difference between (i) the amount of material removed during trimming and pre-trimming and (ii) the amount of material deposited during deposition.

Figure 10C:
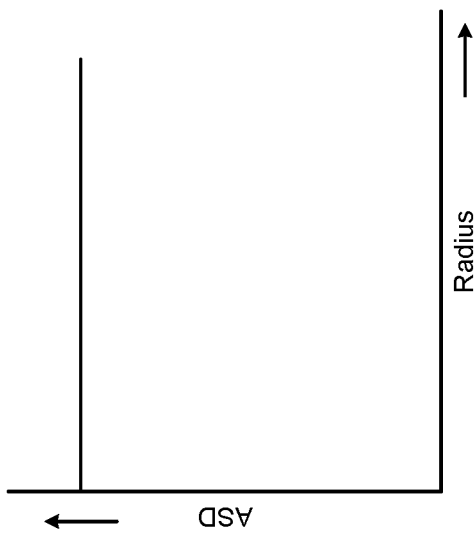
FIG. 10C is an example after spacer deposition (ASD) versus substrate radius plot in accordance with an embodiment of the present disclosure.
Figure 10B:
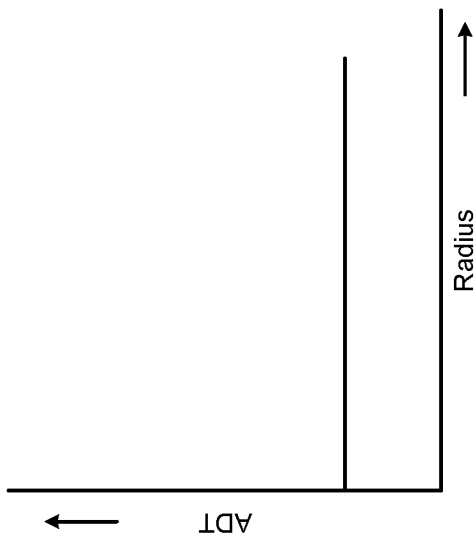
FIG. 10B is an example after develop trim (ADT) versus substrate radius plot in accordance with an embodiment of the present disclosure.
Figure 10A:
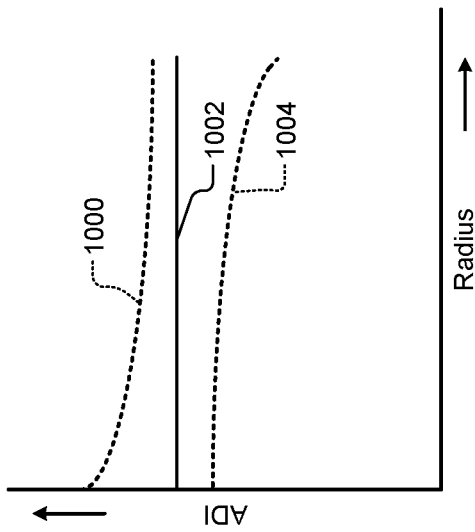
FIG. 10A is an example after develop inspection (ADI) versus substrate radius plot in accordance with an embodiment of the present disclosure.

FIGS. 10A-10C show examples of an ADI versus substrate radius plot, an ADT versus substrate radius plot, and an ASD versus substrate radius plot. The ADI versus substrate radius plot includes three curves, an upper range curve 1000, a target curve 1002, and a lower range curve 1004. The upper and lower range curves 1000, 1004 provide a range that ADI (or CD1) may be prior to trim and deposition steps. The ADT versus substrate radius plot illustrates uniform trim due to the temperature control and compensation disclosed herein during a trim step. The ASD versus substrate radius plot illustrates uniform deposition due to the temperature control and compensation disclosed herein during a deposition step. Photoresist trimming and deposition steps are performed while retaining a post-lithography critical dimension profile (e.g., a nominally flat profile) across a substrate without introducing azimuthal variability during etch or subsequent deposition.

At 918, the solving module 520 and/or the operating parameter module 524 may determine the one or more total correction values. This may be based on the one or more critical dimension imbalance values and/or an inputted and/or or determined ADI value. The total correction values may include and/or be directly related to the ASD, ADT, ADD values and/or the one or more critical dimension imbalance values.

At 920, the solving module 520 may determine whether another trim or deposition step is to be performed. If another trim or deposition operation is to be performed, operation 926 may be performed, otherwise operation 922 may be performed. At 922, the solving module 520 may determine whether another substrate is to be processed. If another substrate is to be processed, operation 926 may be performed, otherwise the method may end at 924.

At 926, the solving module 520 may determine if a development process is being performed. If a development process is being performed, then operation 906 may be performed, otherwise operation 910 is performed. Returning to operation 906 provides a feedback loop. Operation 910 may be performed during high-volume manufacturing.

The above-described method links incoming profiles to output results of trim and deposition steps. This linking may occur as part of a start-up routine. The method provides a sequence to fully characterize and store the sensitivities of substrates. The method allows a user to interface with the corresponding processing system including inputting target and/or substrate profiles, which are then used to provide resulting critical dimensions. This allows for settings and conditions to be adjusted on a per-lot and a per-wafer basis based on variation in incoming and outgoing processes (e.g., lithography and/or etch processes).

A trim step is typically performed between a lithography step and a spacer deposition step to reduce a critical dimension. Although a main purpose of the trim step is to reduce the critical dimension of, for example a photoresist mandrel, the trim step may also be used to compensate for WiW and WTW NU and improve space imbalance. The space imbalance is mainly affected by the trim step and thus an ability to tune trim steps and NU across a substrate is described herein to satisfy specification requirements for WiW NU. Thermal control elements are used in a multi-zone manner to control critical dimension NU during trim steps to adjust temperature both radially and azimuthally. This is accomplished by first determining trim sensitivity relative to temperature and adjusting the temperature accordingly to provide target critical dimensions. This temperature-based compensation may be implemented for critical dimension variability WTW and/or lot-to-lot and to compensate for etch induced line critical dimension NU. The stated compensation may also be used to compensate for chamber asymmetry induced NU (e.g., deposition profile tilt towards spindle).

FIG. 11 shows a trim calibration method, which may be iteratively performed to determine trim sensitivity calibration values for each of the TCEs and/or other devices used to adjust temperature of the substrate support. The method may be performed for each TCE, set of TCEs, temperature controlled zones, and/or for each trim step performed. The method may begin at 1100. At 1102, a substrate is arranged on a substrate support (e.g., the substrate support 104).

At 1104, the calibration module 522 obtains baseline settings including baseline temperature settings and a baseline critical dimension profile for a trim step. The baseline settings may include baseline pressures, flow rates, gas mixtures, etc. The baseline temperature settings may include TCE settings, such as duty cycles, power levels, current levels, and voltages. The baseline critical dimension profile may include critical dimensions of features previously measured for a first (or baseline) substrate after performing a trim step using the baseline settings. In one embodiment, the baseline temperature settings provide uniform temperature across the substrate support.

At 1106, the calibration module 522 sets chamber operating parameters to the baseline settings except adjusts one or more of the temperature settings (or TCE parameters) a predetermined amount. This is done to perform a trim sensitivity calibration test of one or more of the TCEs.

At 1108, the operating parameter module 524 and the solving module 520 perform the trim operation on a second substrate with the chamber operating parameters set to the baseline settings except the adjusted one or more of the temperature settings as described for operation 1106.

At 1110, the calibration module 522 may initiate a metrology operation to obtain a post trim critical dimension profile. As an example, this may include signaling the host controller 502 and/or the metrology device 504 to perform metrology operations to obtain critical dimensions of features of the second substrate. The critical dimensions may be saved as the post trim critical dimension profile. At 1112, the calibration module 522 determines trim sensitivity calibration values based on differences between the baseline critical dimensions and the post trim critical dimensions determined at 1110. This provides amounts (or thicknesses) of material removed during trimming. The trim sensitivity calibration values may refer to changes in trim amounts per degree change in temperature, which may be measured in Angstroms per degree Celsius (A/C).

At 1114, the calibration module 522 may receive a target trim critical dimension profile having target critical dimensions from the user interface 500, the solving module 520 and/or the memory 506. At 1116, the calibration module 522 may calculate differences between critical dimension values of the target trim critical dimension profile and corresponding critical dimension values of the baseline and/or post critical dimension profile.

At 1118, the calibration module 522 determines trim temperature settings to achieve the target trim critical dimension profile based on the trim sensitivity calibration values (or trim rates relative to temperature) and differences between the baseline trim critical dimension profile and the target critical dimension profile. At 1120, the calibration module 522 stores the trim sensitivity calibration values and the trim temperature settings in, for example, the memory 506. The method may end at 1122.

The trim calibration and steps performed during the methods of FIGS. 9 and 11 aid in reducing core critical dimensions (e.g., critical dimension S1 in FIG. 3D) and gap critical dimensions (e.g., critical dimension S2 in FIG. 3D). Space S1 is a function of trim and photoresist consumption during deposition. The line width L is a function of ALD spacer layer thickness and corresponding thickness after etching. Space S2 is a function of the space S1 and the line width L. A space critical dimension imbalance may be set equal to an absolute value of S1 minus S2. Space critical dimension imbalance depends on post trim sacrificial core profile and uniformity. Radial and azimuthal tunability of a trim profile is thus performed in the methods of FIGS. 9 and 11 to achieve a target substrate profile. The described methods improve CD3, S1, and S2 NU to compensate for photolithography induced and etch NU. The described tuning provides fine control over radial and azimuthal temperature settings to provide target critical dimensions.

A challenge in a double patterning process is obtaining tight control on critical dimensions of widths of lines and imbalance of critical dimensions of spaces between lines. Critical dimension NU and imbalance is a result of both lithography NU and spacer layer NU. A critical dimension of a line is affected by spacer layer deposition. The methods of FIGS. 9 and 12 are performed to control tuning of spacer layer deposition and NU across a substrate to satisfy specification requirements for WiW line critical dimensions. The methods include controlling parameter settings of TCEs during deposition steps including temperature control both radially and azimuthally. This is accomplished by first determining deposition sensitivity to temperature and adjusting the temperature accordingly to achieve target critical dimension results. This temperature based compensation may be implemented for critical dimension variability WTW and lot-to-lot and to compensate for etch induced line critical dimension NU. The temperature based compensation may also be used to compensate for chamber asymmetry induced NU (e.g., deposition profile tilt towards spindle).

FIG. 12 shows a deposition calibration method, which may be iteratively performed to determine deposition sensitivity calibration values for each of the TCEs and/or other devices used to adjust temperature of the substrate support. The method may be performed for each TCE, set of TCEs, temperature controlled zones, and/or for each deposition step performed. The method may begin at 1200. At 1202, a substrate is arranged on a substrate support (e.g., the substrate support 104).

At 1204, the calibration module 522 obtains baseline settings including baseline temperature settings and a baseline critical dimension profile for a deposition step. The baseline settings may include pressures, flow rates, gas mixtures, etc. The baseline temperature settings may include TCE parameters, such as duty cycles, power levels, current levels, and voltages. The baseline critical dimension profile may include critical dimensions of features previously measured for a first substrate after performing a deposition step using the baseline settings. In one embodiment, the baseline temperature settings provide uniform temperature across the substrate support.

At 1206, the calibration module 522 sets chamber operating parameters to the baseline settings except adjusts one or more of the temperature settings (or TCE parameters) a predetermined amount. This is done to perform a deposition sensitivity calibration test of one or more of the TCEs.

At 1208, the operating parameter module 524 and the solving module 520 perform the deposition operation on a second substrate with the chamber operating parameters set to the baseline settings except the adjusted one or more of the temperature settings as described for operation 1206.

At 1210, the calibration module 522 may initiate a metrology operation to obtain a post deposition critical dimension profile. As an example, this may include signaling the host controller 502 and/or the metrology device 504 to perform metrology operations to obtain critical dimensions of features of the substrate. The critical dimensions may be saved as the post deposition critical dimension profile. At 1212, the calibration module 522 determines deposition sensitivity values based on differences between the baseline critical dimensions and the post deposition critical dimensions determined at 1210. This provides amounts (or thicknesses) of material deposited during deposition.

At 1214, the calibration module 522 may receive a target deposition critical dimension profile having target critical dimensions from the user interface 500, the solving module 520 and/or the memory 506. At 1216, the calibration module 522 may calculate differences between critical dimension values of the target deposition critical dimension profile and corresponding critical dimension values of the baseline and/or post critical dimension profile.

At 1218, the calibration module 522 determines deposition temperature settings to achieve the target deposition critical dimension profile based on the deposition sensitivity calibration values (or deposition rates relative to temperature) and differences between the baseline deposition critical dimension profile and the target critical dimension profile. At 1220, the calibration module 522 stores the deposition sensitivity calibration values and the deposition temperature settings in, for example, the memory 506. The method may end at 1222.

The above-described operations of FIGS. 9 and 11-12 are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The described methods provide local critical dimension NU control and compensation for critical dimension variability WiW, WtW and lot-to-lot, which are not provided by simply controlling and adjusting gas flow, pressure, and/or valve timing. The methods provide fine-tuned trim and deposition profiles, which reduce critical dimension NU and imbalance.

Figure 13:
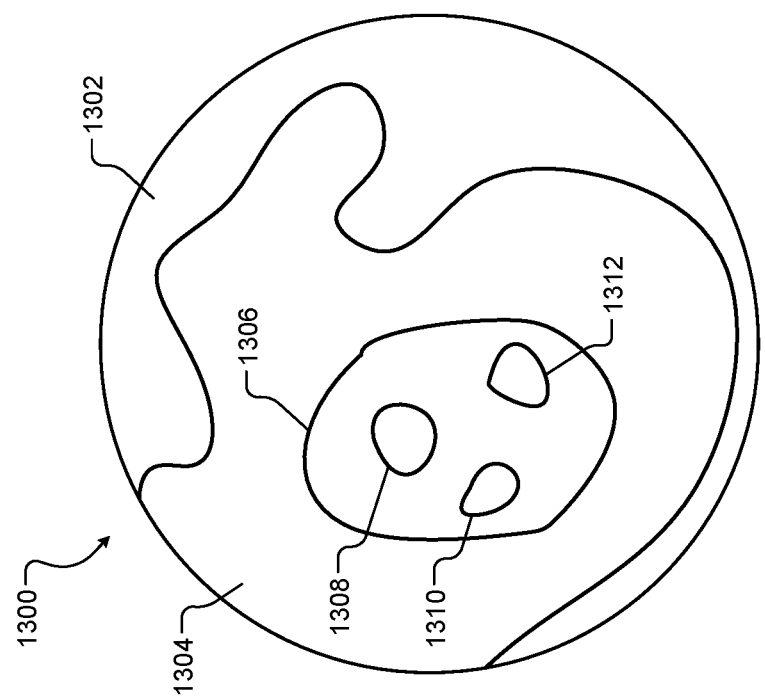
FIG. 13 is an example baseline temperature profile plot in accordance with an embodiment of the present disclosure.

FIG. 13 shows an example baseline temperature profile plot 1300 corresponding to baseline temperature settings, as described above for operations 1104, 1204 of FIGS. 11-12. The baseline temperature profile plot 1300 illustrates temperatures across a substrate support. The baseline temperature profile plot 1300 includes areas 1302, 1304, 1306, 1308, 1310 and 1312, which may have different temperatures. A different number of areas may be included than shown. The areas 1302, 1304, 1306, 1308, 1310 and 1312 are shown as examples and may have different shapes and/or sizes. The temperatures in each of the areas 1302, 1304, 1306, 1308, 1310 and 1312 may be the same across that area or may vary.

Figure 14:
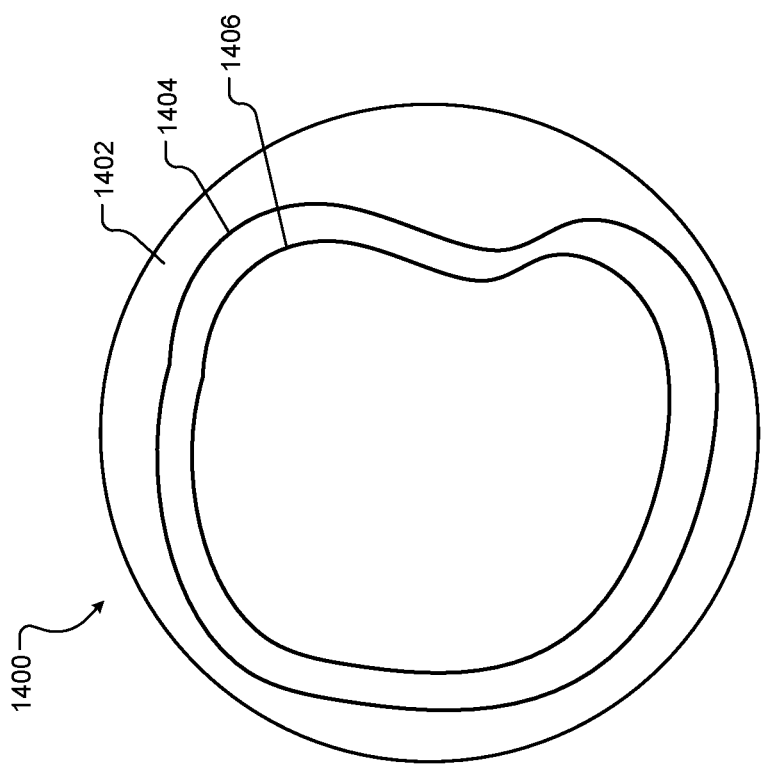
FIG. 14 is an example baseline deposition profile plot in accordance with an embodiment of the present disclosure.

FIG. 14 shows a baseline deposition critical dimension profile plot 1400, which is provided as an example of the baseline deposition critical dimension profile referred to for operations 1204, 1212 and 1216 of FIG. 12. The baseline deposition critical dimension profile plot 1400 illustrates deposition amounts across a substrate support. The baseline deposition critical dimension profile plot 1400 includes areas 1402, 1404 and 1406, which may have different deposition amounts. A different number of areas may be included than shown. The areas 1402, 1404 and 1406 are shown as examples and may have different shapes and/or sizes. The deposition amounts in each of the areas 1402, 1404 and 1406 may be the same across that area or may vary.

Figure 16:
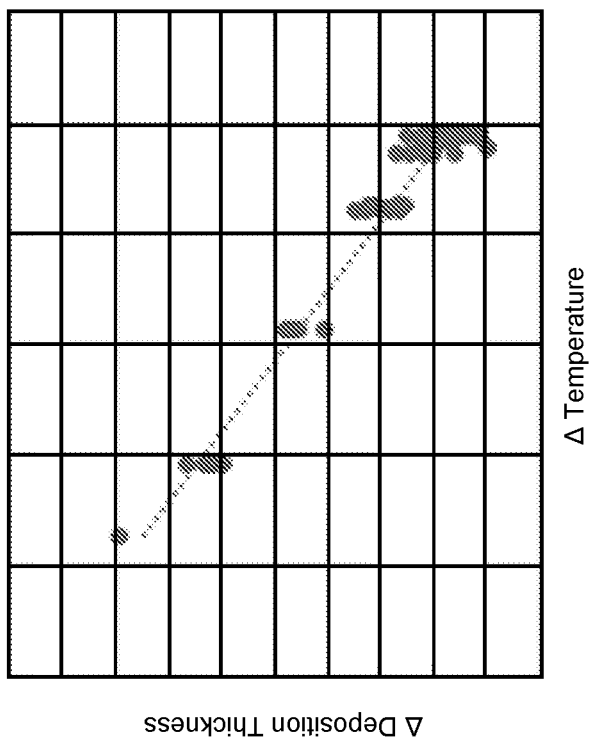
FIG. 16 is an example sensitivity plot of differences in thicknesses versus change in temperature in accordance with an embodiment of the present disclosure.
Figure 15:
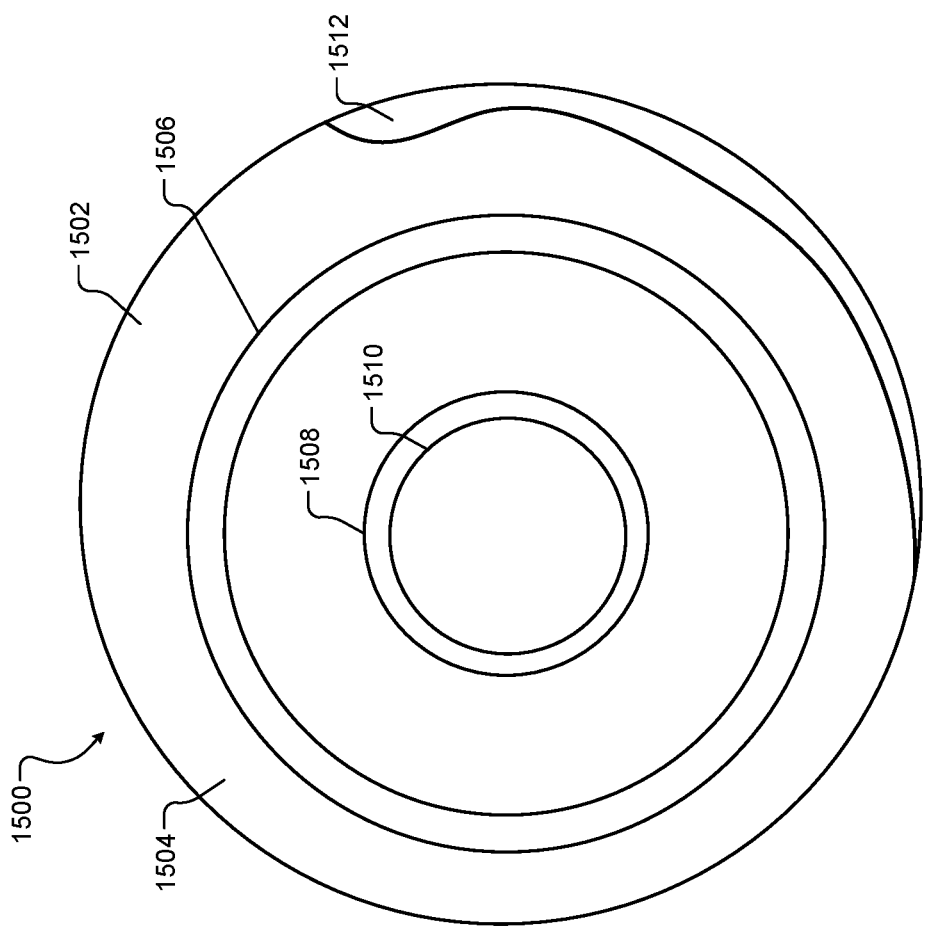
FIG. 15 is an example target deposition profile plot in accordance with an embodiment of the present disclosure.

FIG. 15 shows a target deposition profile plot 1500, which is provided as an example of the target deposition profile referred to for operation 1214, 1216 and 1218 of FIG. 12. The target deposition profile plot 1500 illustrates target depositions across a substrate support. The target deposition profile plot 1500 includes areas 1502, 1504, 1506, 1508, 1510 and 1512, which may have different amounts of deposition. A different number of areas may be included than shown. The areas 1502, 1504, 1506, 1508, 1510 and 1512 are shown as examples and may have different shapes and/or sizes. The deposition amounts in each of the areas 1502, 1504, 1506, 1508, 1510 and 1512 may be the same across that area or may vary. FIG. 16 shows an example sensitivity plot of differences in deposition thicknesses versus change in temperature. The sensitivity plot is an example illustrating sensitivity calibration values determined at 1212 of FIG. 12.

Figure 17:
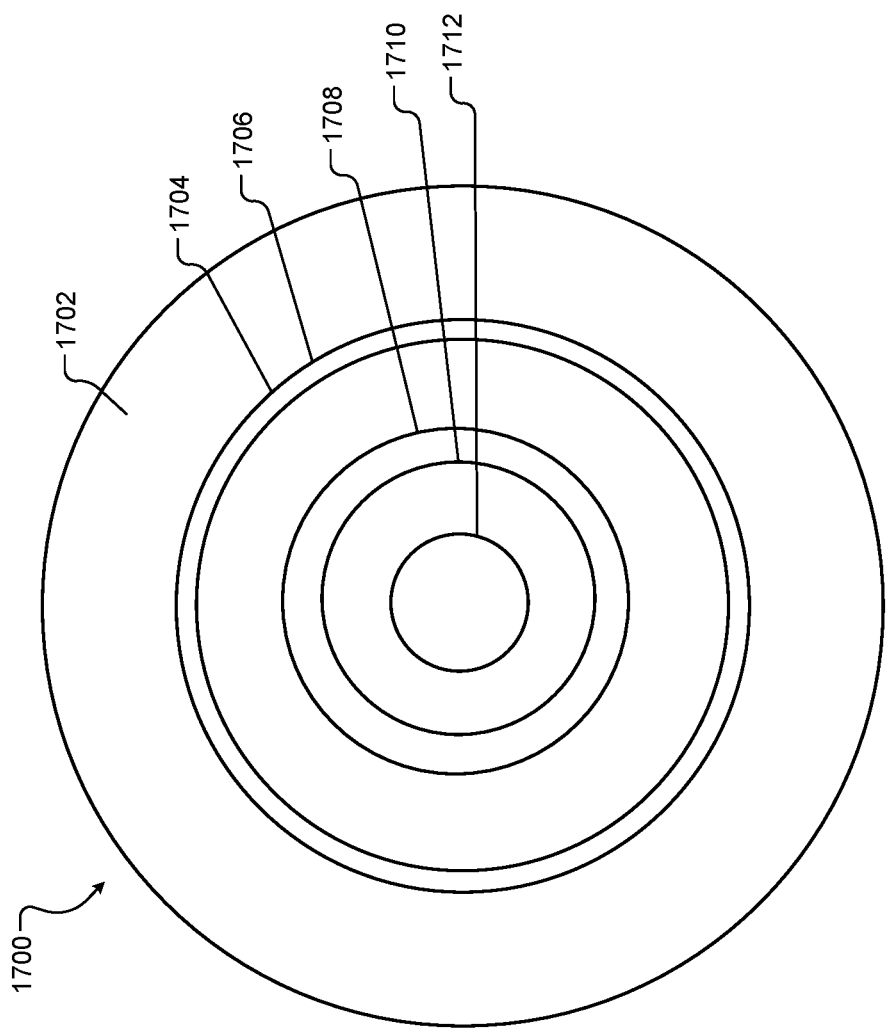
FIG. 17 is an example target temperature profile plot in accordance with an embodiment of the present disclosure.

FIG. 17 shows a target temperature profile plot 1700, which is an example of a target temperature profile that may be used when performing a trim or deposition step to provide certain critical dimensions. This target temperature profile 1700 may be used during, for example, operation 912 of FIG. 9. The target temperature profile plot 1700 illustrates target temperatures across a substrate support. The target temperature profile plot 1700 includes areas 1702, 1704, 1706, 1708, 1710 and 1712, which may have different temperatures. A different number of areas may be included than shown. The areas 1702, 1704, 1706, 1708, 1710 and 1712 are shown as examples and may have different shapes and/or sizes. The temperatures in each of the areas 1702, 1704, 1706, 1708, 1710 and 1712 may be the same across that area or may vary.

Figure 18:
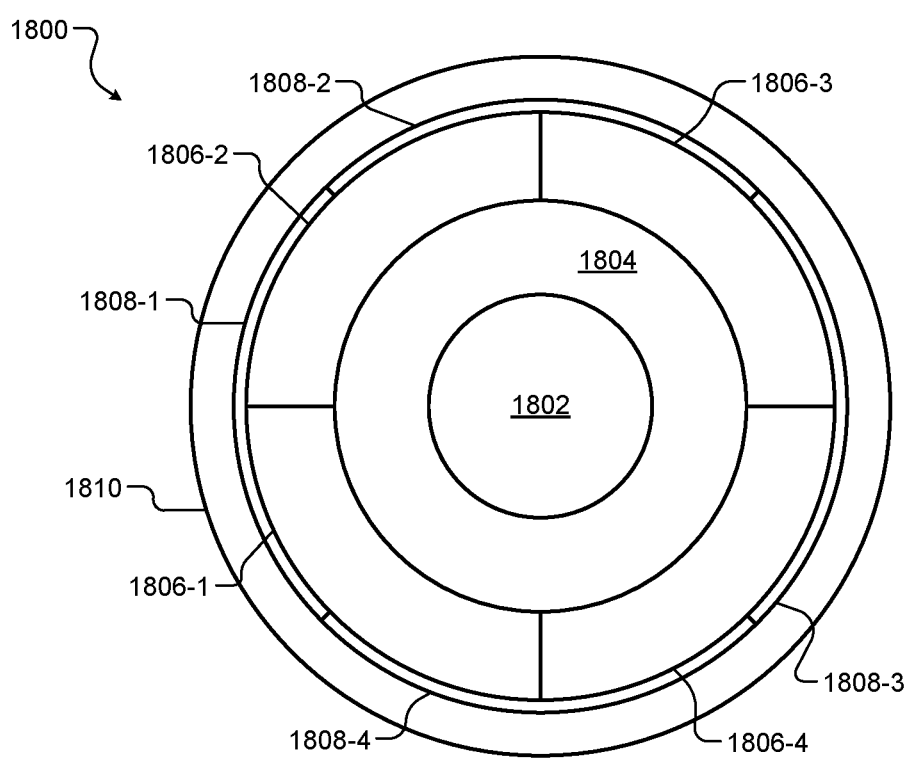
FIG. 18 is an example top view of a substrate support including 11 heater zones.

FIG. 18 shows a substrate support 1800 including 11 heater zones. As shown, the substrate support 1800 includes a central zone 1802, an inner-mid radius zone 1804, four outer-mid radius zones (i.e., an outer-mid radius zone 1806 comprising four segments 1806-1, 1806-2, 1806-3, and 1806-4), and four outer edge zones (i.e., an outer edge zone 1808 comprising four segments 1808-1, 1808-2, 1808-3, and 1808-4). The segments of the outer edge zone 1808 are offset from (i.e., rotated with respect to) the segments of the outer-mid radius zone 1806 (e.g., by 45°). In some examples, the substrate support 1800 may include a second outer edge zone 1810 radially outside of the outer edge zone 1808. For example, an inner diameter of the second outer edge zone 1810 may be greater than a diameter of a substrate. A temperature of the substrate support 1800 may be controlled by using separately-controllable resistive heaters 160 arranged in respective ones of the zones 1802, 1804, 1806, 1808, 1810.

In some examples, the outer edge zone 1808 overlaps and/or extends beyond (i.e., in a radial direction) an outer edge of the substrate. For example, for a 300 mm substrate, the radius of the outer edge zone 1808 may be greater than 300 mm. Further, a width of the outer edge zone 1808 (i.e., a distance from an inner radius to an outer radius) is less than a width of the inner-mid radius zone 1804 and the outer-mid radius zone 1806. For example, the width of the outer edge zone 1808 may be approximately 10 mm (e.g., +/−2 mm) while the respective widths of the inner-mid radius zone 1804 and the outer-mid radius zone 1806 may be approximately 40 mm (e.g., +/−2 mm). The relatively narrow width of the outer edge zone 1808 facilitates fine tuning at the outer edge of the substrate.

Figure 19:
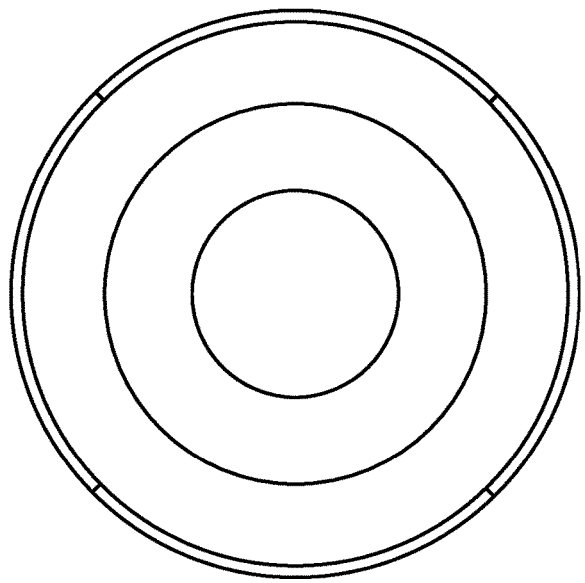
FIG. 19 is an example top view of a substrate support including 7 heater zones.
Figure 21:
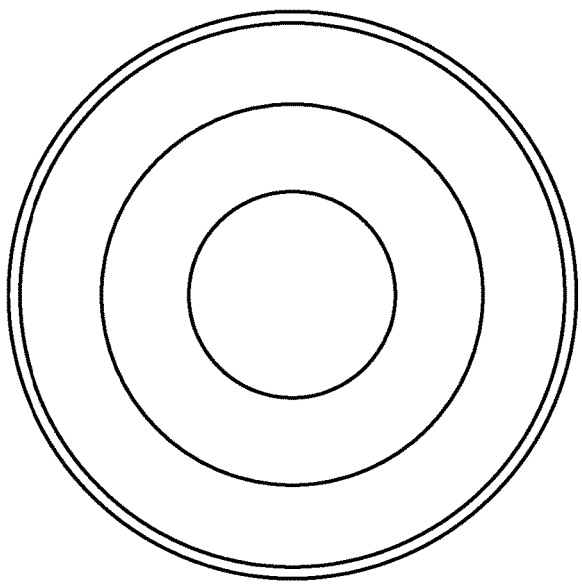
FIG. 21 is an example top view of a substrate support including 4 concentric heater zones.
Figure 20:
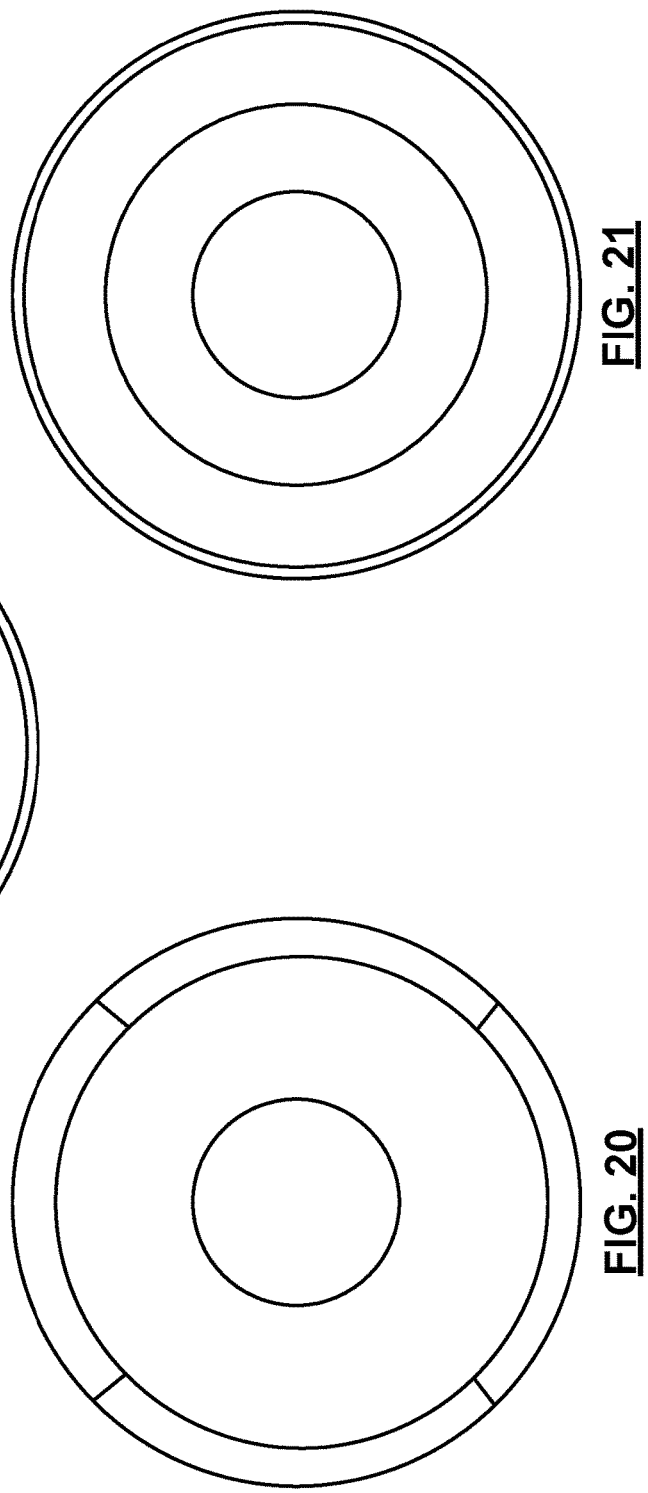
FIG. 20 is an example top view of a substrate support including 6 heater zones.

The arrangement of the zones allow for compensation for both radial and azimuthal thickness NUs, as well as compensation for NUs at a narrow outer edge region of the substrate. For example only, FIGS. 19-21 show other example zone arrangements. In other examples, a substrate support may include other arrangements and combinations of radial and azimuthal zones. For example, the substrate support may include fewer (e.g., two) or more (e.g., 20 or more) zones, and each radial zone may be segmented into 2 to 8 or more separately controllable radial and azimuthal zones to increase tunability.

The temperatures of the zones may be controlled according to a predetermined temperature control profile for a known NU profile. For example, one or more temperature control profiles may be stored (e.g., in the temperature controller 162 and/or in memory accessible by the controller 162), input by a user, etc. Each of the temperature control profiles may be correlated to a predetermined NU profile (e.g., for a given process or recipe, processing chamber, etc.). According, during an ALD process, the heater zones may be individually controlled and adjusted to compensate for deposition NUs. The temperature control profiles correspond to target temperatures for each zone of the substrate support and may be calibrated according to expected temperature outputs of the zones for a given substrate support. In some examples, the temperature control profiles correlate a film property (e.g., thickness, deposition rate, etc.) and/or a temperature of the zone to one or more heater zone control parameters (e.g., duty cycle, percent output, etc.). Accordingly, a predetermined temperature control profile may be retrieved in accordance with a desired temperature distribution, film thickness, and/or other film property and the heater zones are controlled based on the heater zone control parameters in the retrieved temperature control profile.

Temperatures of respective heater zones may be controlled according to one or more types of feedback. In one example, each zone may include a respective temperature sensor. In another example, temperatures of each zone may be calculated. For example, a voltage and current of a resistive heater (e.g., using voltage and current sensors) may be measured to determine a resistance of the resistive heater. Since the resistance characteristics of the resistive heater are known, a temperature of the respective zone can be calculated based on a change in resistance caused by an associated change in temperature. In some examples, feedback may be provided using a combination of temperature sensors and calculations using other sensed or measured parameters such as voltage and current.

FIG. 22 shows a temperature calibration method for a substrate support. The method includes calculating a power input to one or more TCEs of a substrate support. The method may begin at 2200. At 2202, the solving module 520 setting the one or more TCEs to a first predetermined power level. At 2204, the temperature detector 161 detects first temperatures or a spatial temperature response pattern of the one or more TCEs.

At 2206, the solving module 520 sets the one or more TCEs to one or more second predetermined power levels. At 2208, the temperature detector 161 detects second temperatures or a spatial temperature response pattern of the one or more TCEs.

In an embodiment, during the setting of the first predetermined power levels, each of the TCEs is set to a same power level and during the setting of the second predetermined power levels, each of the TCEs is not powered. In another embodiment, the first predetermined power levels are maximum power levels for the TCEs.

At 2210, the solving module 520 calculates differences between the first temperatures and the second temperatures respectively for the TCEs. Thus, two measurements are taken for each TCE. Instead of measuring a temperature of a TCE while at maximum power level and while in a depowered state, an alternative approach includes setting the TCE to intermediate power levels and measuring corresponding temperatures while at the intermediate power levels. Multiple TCEs may be powered at a same time.

At 2212, the solving module 520 calculates a system response of the one or more TCEs based on the differences calculated at 2210. In an embodiment, the calculated system response is an algorithm to determine a relation between power supplied and resulting temperatures of the one or more TCEs. In an embodiment, the calculated system response is a matrix that includes vectors. The matrix may be a unit response matrix. At 2214, the solving module 520 may invert the system response.

At 2216, the solving module 520 calibrates the one or more TCEs based on the inverted system response. In an embodiment, the method of FIG. 22 may also include validating this calibration. In an embodiment, the method may include manipulating the at least one thermal image temperature detector 161 to perform two-dimensional temperature prediction of the substrate support and/or substrate being processed. Similarly, the method may include determining thermal energy output of the substrate support based on the thermal image. The method may end at 2218.

FIG. 23 shows another temperature calibration method for a substrate support, which is similar to the method of FIG. 22. The method may begin at 2300. At 2302, a TCE is not powered and a first temperature of the TCE is measured. At 2304, the first temperature is stored in memory.

At 2306, the solving module 520 sets the TCE to an updated (or second) power level greater than zero (or the first power level). At 2308, a second temperature of the powered TCE is measured. At 2310, the second temperature is stored in memory.

At 2312, the solving module 520 determines a difference between the first and second power levels and a difference between the first and second temperatures are determined. At 2314, the solving module 520 stores the differences in power levels and temperatures. At 2316, the solving module 520 determines whether to perform another power level update. If yes, operation 2306 is performed, otherwise operation 2320 is performed.

At 2320, the solving module 520 determines whether the difference values fit a previously determined function. If not, operation 2322 is performed and a function is fitted to difference values. This may be performed for each TCE. If the difference values do fit a previously determined function, then a system response is calculated at 2324 based on the power levels, the temperatures, and the differences. At 2326, the system response may be inverted. The method may end at 2328.

The above-described methods of FIGS. 22-23 determine a system response for provided power levels and by inverting the system response provide the power demands for a targeted temperature profile. Vectorization of an infrared image and power set points allows problem solving using a matrix equation.

Figure 24:
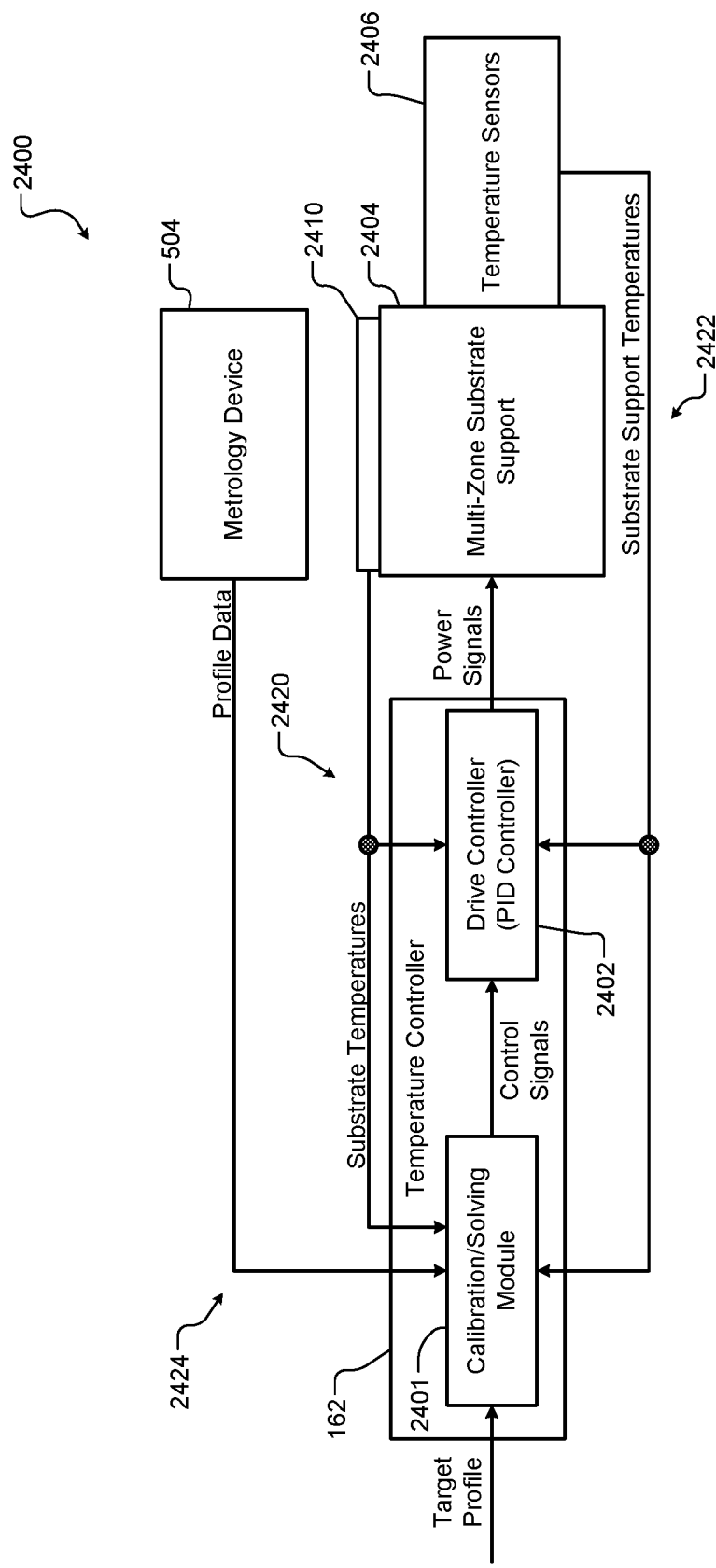
FIG. 24 is a functional block diagram of an example calibration and processing system in accordance with an embodiment of the present disclosure.

Referring now to FIGS. 1, 5 and 24, which shows an example calibration and processing system 2400. The calibration and processing system 2400 includes the temperature controller 162 of FIG. 1, a calibration/solving module 2401 (e.g., the calibration module 522 or the solving module 520 of FIG. 5), the drive controller 2402, a multi-zone substrate support 2404, temperature sensors 2406, the metrology device 504, and a thermocouple substrate 2410. The multi-zone substrate support 2404 may be structured and operated similar to the substrate support 104.

The temperature calibration system 2400 includes multiple feedback loops 2420, 2422, 2424. The feedback loops are provided via: (i) temperature sensor signals provided from the temperature sensors 2406 to the calibration/solving module 2401 and/or the drive controller 2402; (ii) the temperature sensor signals provided from the thermocouple substrate 2410 to the calibration/solving module 2401 and/ or the drive controller 2402; and (iii) metrology signals provided from the metrology device 504 to the calibration/ solving module 2401. One of the feedback loops may be utilized for a calibration, trim or deposition process being performed. Multiple feedback loops may be utilized when performing more than one calibration, trim and/or deposition process. For example, a first feedback loop may be performed when performing a first trim process and a second feedback loop may be performed when performing a second trim process. As another example, a first feedback loop may be used when performing a deposition operation and a second feedback loop may be performed when performing a trim process subsequent to the deposition process.

The feedback loops 2420 and 2422 are used respectively for hardware fine tune calibration of the multi-zone substrate support 2404 and the thermocouple substrate 2410. The feedback loop 2424 is used for process fine tuning for substrate profile matching within a particular station of a process chamber (or processing module). As an example, a process chamber (or processing module) may include a predetermined number of stations (e.g., 4 stations), where each station includes a respective multi-zone substrate support. The temperature controller 162 may control calibration and processing at each of the stations.

During operation, the calibration/solving module 2401 may receive a target profile. The target profile may be loaded via a user and/or may be received from a network device. The target profile may be a target substrate temperature profile, a target substrate support temperature profile, a target power profile, a target substrate thickness profile or the like. Each of the profiles may include target temperatures across a substrate, target temperatures across a substrate support, target critical dimensions (e.g., target thicknesses across the substrate), etc. The target profile may be loaded when preparing to perform, for example, critical dimension, trim or deposition process.

The calibration/solving module 2401 in addition to performing the operations and functions described above, may receive: temperatures signals from the thermocouple substrate 2410 during a temperature calibration of the substrate; temperatures signals from the temperature sensors 2406 during a temperature calibration of the multi-zone substrate support 2404; and metrology signals provided from the metrology device 504 during a sensitivity substrate profile calibration. The calibration/solving module 2401, based on the received temperature signals and the metrology signals, generates control signals to control the drive controller 2402. The drive controller 2402 may: operate as a proportional integral derivative (PID) controller; adjust power settings (e.g., current levels, voltage levels duty cycles, etc.) to adjust power and/or temperature of temperature control elements in the multi-zone substrate support 2404; and/or adjust temperate and/or flow rate of coolant supplied to the multi-zone substrate support 2404. The drive controller 2402 may generate power signals, which are provided to temperature control elements in the multi-zone substrate support and a pump circulating coolant through the multi-zone substrate support. The drive controller 2402 may also generate a pump control signal for the pump 170 of FIG. 1 and/or other temperature control signals.

In one embodiment, temperatures across the thermocouple substrate 2410 are calibrated as a function of duty cycle setpoints. A user may provide a target profile including certain set of temperature setpoints for the thermocouple substrate 2410. The calibration/solving module 2401 may then determine corresponding duty cycle setpoints for the temperature control elements of the multi-zone substrate support 2404. In another embodiment, temperatures across the multi-zone substrate support 2404 are calibrated as a function of duty cycle setpoints. A user may provide a target profile including a certain set of temperature setpoints for the multi-zone substrate support 2404. The calibration/ solving module 2401 may then determine corresponding duty cycle setpoints for the temperature control elements of the multi-zone substrate support 2404. As a couple of alternative embodiments, the user may provide duty cycle profiles for the thermocouple substrate 2410 and the multi-zone substrate support 2404. The calibration/solving module

Figure 25:
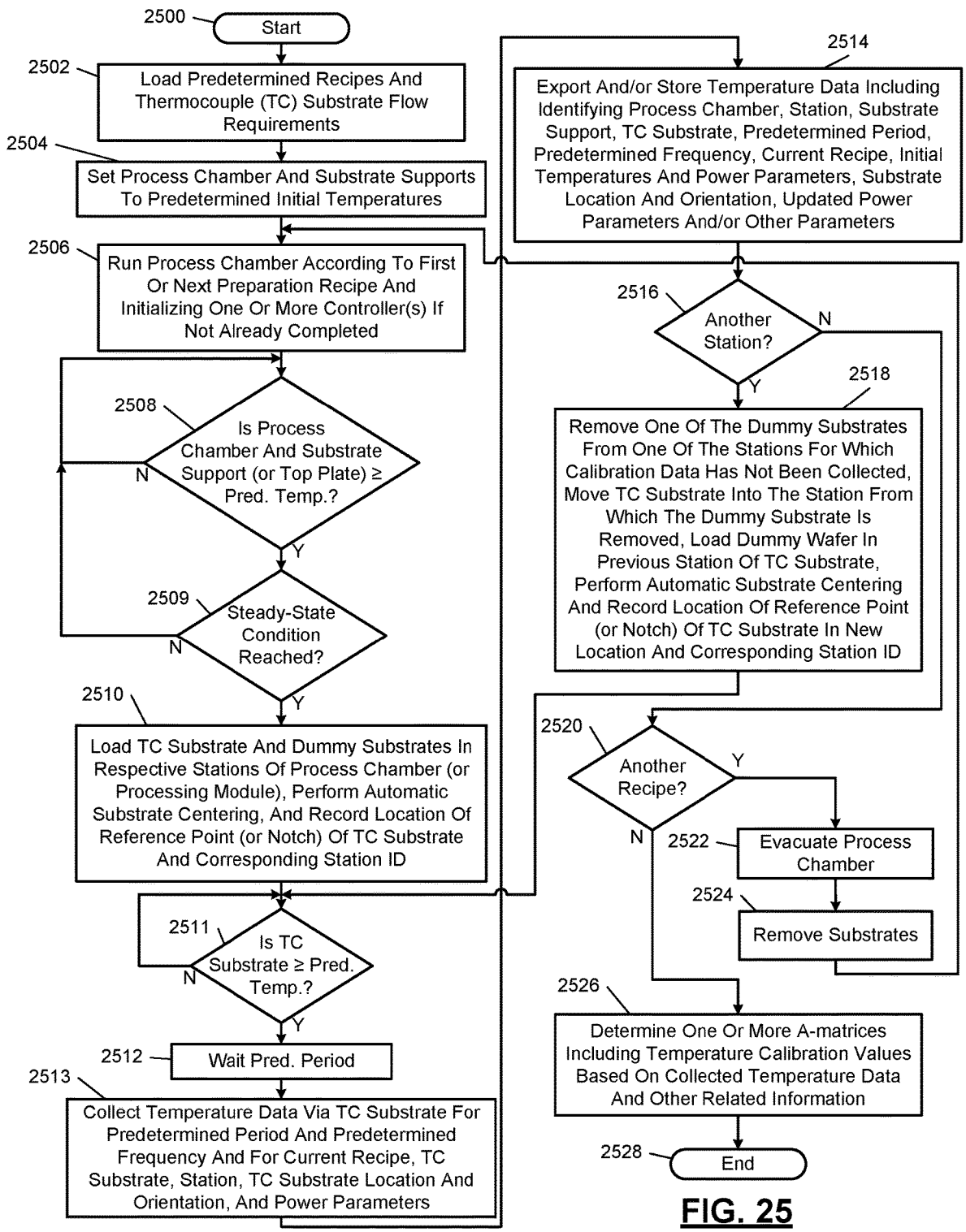
FIG. 25 illustrates an example temperature calibration method in accordance with an embodiment of the present disclosure.

2401 may then determine target temperatures and generate corresponding controls signals for the drive controller 2402 to provide the target temperatures. For these example embodiments, a respective A-matrix including temperature calibration values may be determined as described above prior to providing the duty cycle setpoints. FIG. 25 provides another example for determining the A-matrix.

Figure 27:
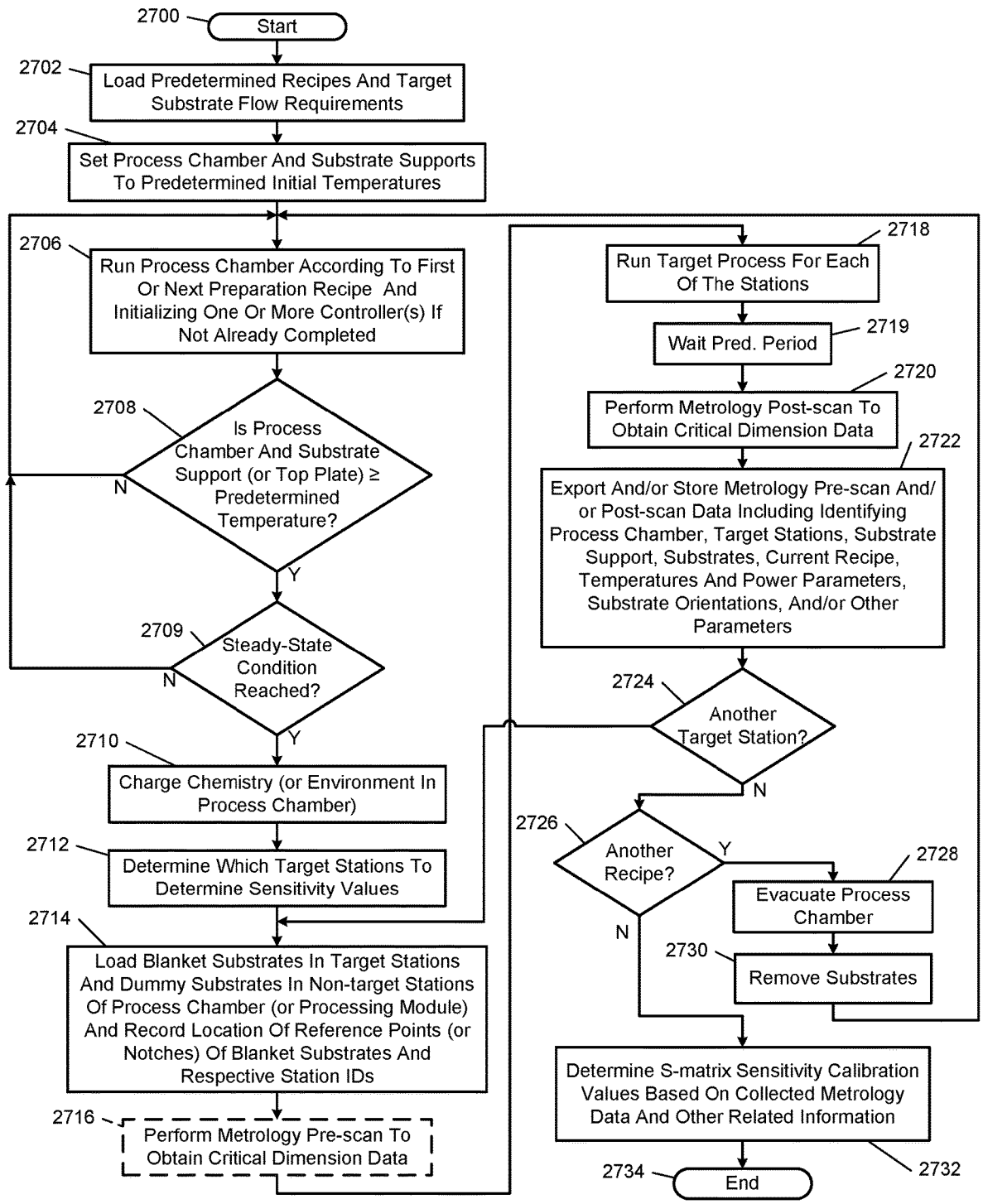
FIG. 27 illustrates an example sensitivity calibration method in accordance with an embodiment of the present disclosure.

In another embodiment, a user may provide a target profile including target substrate thicknesses and/or other physical dimension profile indicating surface and layer dimensions. The dimensions may include thicknesses, depths, heights, and widths of physical features of the thermocouple substrate 2410. The calibration/solving module 2401 may determine a set of target duty cycles and/or temperatures based on the provided target profile. This may be based on an S-matrix having sensitivity calibration values, such as changes in thicknesses relative to changes in temperatures. FIG. 27 provides another example for determining the S-matrix.

The calibration and processing system 2400 may be operated according to the methods of FIGS. 25 and 27. FIG. 25 illustrates a temperature calibration method. The following operations may be iteratively performed. The following operations may be performed by the temperature controller 162 and/or the calibration/solving module 2401.

The method may begin at 2500. At 2502, predetermined recipes and thermocouple (TC) substrate flow requirements are loaded into, for example, the temperature controller 162. The recipes may include, for example, species, pressures, flow rates, etc. The recipes may include other parameters such as timing values, temperatures, etc. The TC substrate flow requirements may refer to an order in which multiple stations are to be calibrated, which corresponds to an order in which a TC substrate is to be placed in each of the stations for obtaining calibration values associated with the TC substrate and each of the stations. For example, if there are four stations, then four sets of calibration values may be determined for each recipe and/or process being performed. The stated loading may include reception of a target profile as described above from a user or network device.

At 2504, the temperature controller 162 and/or the calibration/solving module 2401 sets a process chamber and corresponding substrate supports to predetermined initial temperatures. This may include setting predetermined initial power parameters of temperature control elements and coolant temperatures, pressures and/or flow rates of the substrate supports.

At 2506, the temperature controller 162 and/or the calibration/solving module 2401 may (i) run the process chamber according to a first or next preparation recipe for at least a predetermined period to obtain steady-state, and (ii) initialize one or more controllers if not already completed. The first preparation recipe may be the same or different than that used to set the process chamber and the substrate supports to the predetermined initial temperatures. This may include increasing temperatures of one or more zones of the substrate support. Table 1 below provides an example of a series of preparation recipes being implemented through iterations of this method. During a first iteration, the initial condition may be unknown and the first preparation recipe may be identified as E0, which has a wait period of R1 minutes that is implemented at 2509. During a next iteration, the initial condition is known and is associated with or referred to as the preparation recipe E0 (or a last implemented preparation recipe) and a next preparation recipe is implemented. The initial condition may refer to temperatures of the process chamber and substrate supports as well as other states of the process chamber and substrate supports as a result of implementing the last preparation recipe. The preparation recipes may be long to generate technical data management streaming (TDMS) file data to confirm stabilization of resistance temperature detectors (RTDs) of the TC substrate.

TABLE 1

| Initial Condition | Preparation Recipe | Wait Period |
| --- | --- | --- |
| Unknown/Any | E0 | R1 minutes |
| E0 | E1 | R1 minutes |
| E1 | E2 | R2 minutes |
| E2 | E3 | R3 minutes |
| E3 | E4 | R4 minutes |
| E4 | E5 | R5 minutes |
| E5 | E6 | R6 minutes |
| E6 | E7 | R7 minutes |
| E7 | E8 | R8 minutes |
| E8 | E9 | R9 minutes |
| E9 | E10 | R10 minutes |

At 2508, the temperature controller 162 and/or the calibration/solving module 2401 determines whether temperatures of the process chamber and the substrate supports (or top plates of the substrate supports) are greater than or equal to predetermined temperatures (e.g., the predetermined initial temperatures). If yes, operation 2509 is performed.

At 2509, the temperature controller 162 and/or the calibration/solving module 2401 determines whether a steady-state condition has been reached. This may include for example determining whether a first predetermined period has lapsed and/or whether temperatures of the process chamber and the substrate supports have stabilized for the first predetermined period (e.g., 10-60 minutes). The temperature controller 162 and/or the calibration/solving module 2401 may refrain from charging the chemistry (or species) within the process chamber.

The first predetermined (or wait) period is used for efficiency purposes. This allows the calibration associated with each recipe to be performed while waiting long enough for steady-state to occur for each iteration of this method. By knowing the initial condition and the new condition (or current preparation recipe), the amount of time to get to steady-state may be determined by the temperature controller 162 and/or the calibration/solving module 2401. The first predetermined period may be determined based on the determined amount of time to get to steady-state. The wait time may be set based on the initial and new conditions. The wait time may be increased, for example, if power to one or more of the temperature control elements is lost, a wrong recipe is run, experiments are run out of order, and/or other fault is detected. The wait time may be increased by a safe amount of time (e.g., 60 minutes).

At 2510, the TC substrate and dummy substrates are loaded into respective stations and on respective substrate supports of the process chamber. The TC substrate is loaded into one of the stations and the dummy substrates are loaded in the other stations. Automatic centering of the substrates on the substrate supports is performed. The TC substrate may include a notch or other reference point. Location of the reference point is recorded to indicate the angular position of the TC substrate in the corresponding station. The location and orientation of the TC substrate, an identifier (ID) of the TC substrate, an ID of the substrate support, an ID of the station, and an ID of the process chamber may be stored in memory and linked to data collected during operation 2512. During multiple iterations of this method, the TC substrate is placed in each of the stations. The reference point of the TC substrate may be at a different angular location when in each of the stations.

At 2511, the temperature controller 162 and/or the calibration/solving module 2401 determines whether temperatures of the TC substrate are greater than or equal to predetermined temperatures. If yes, operation 2512 is performed. At 2512, the temperature controller 162 and/or the calibration/solving module 2401 waits a second predetermined period (e.g., 300 seconds) before proceeding to operation 2513. The wait time may be increased, for example, if power to one or more of the temperature control elements is lost, a wrong recipe is run, experiments are run out of order, and/or other fault is detected. The wait time may be increased by a safe amount of time (e.g., 60 minutes).

Figure 26B:
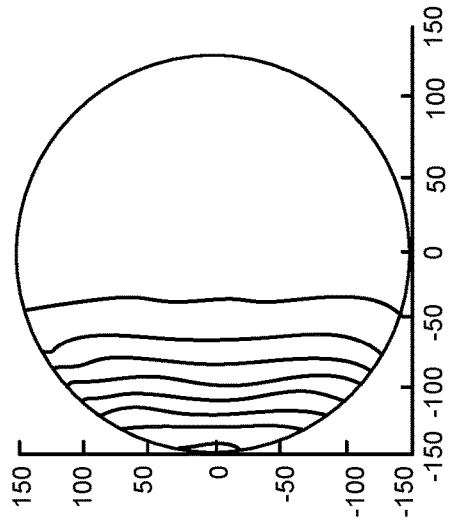
FIG. 26A through 26J are examples of temperature distribution profile plots collected during the temperature calibration method of FIG. 25.
Figure 26D:
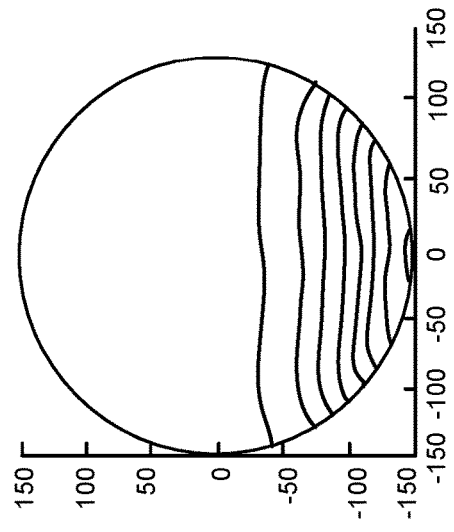
Figure 26A:
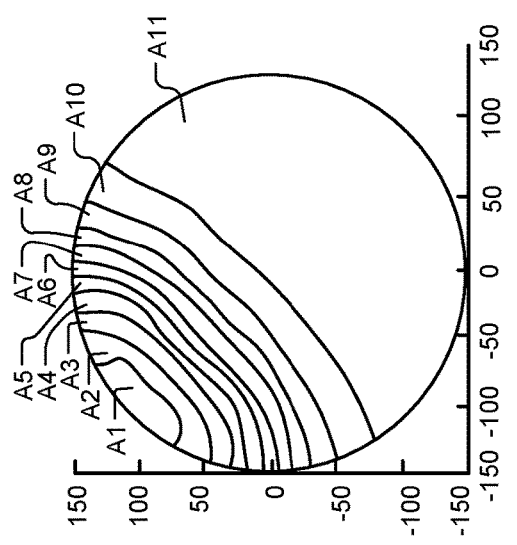
Figure 26C:
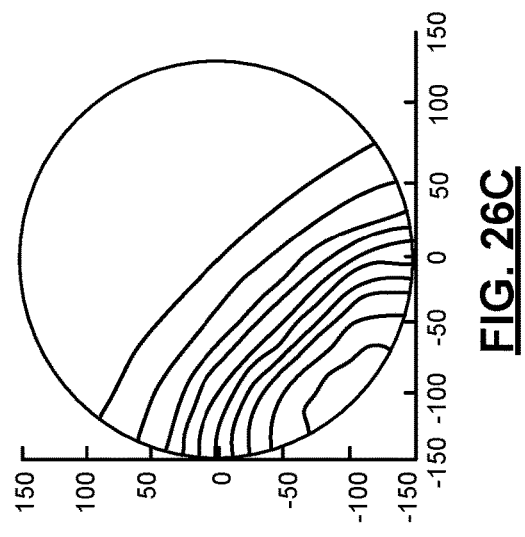
Figure 26E:
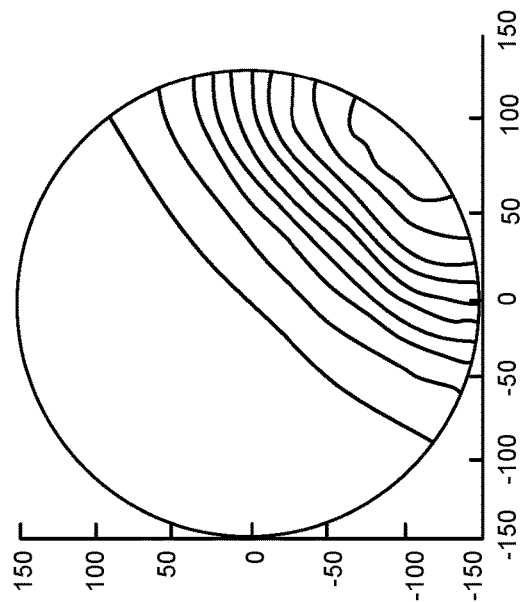
Figure 26G:
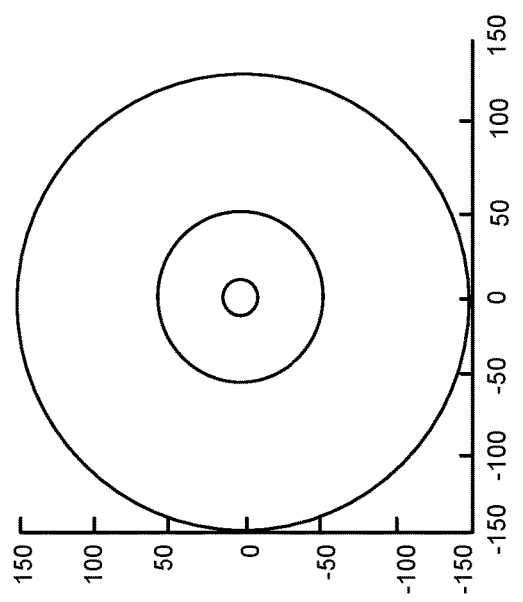
Figure 26F:
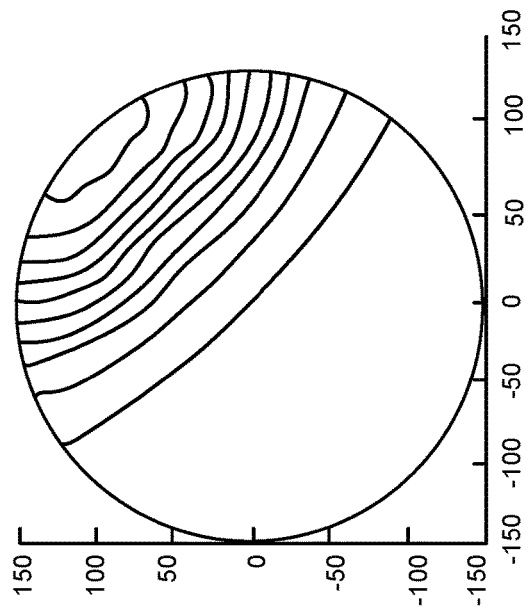
Figure 26H:
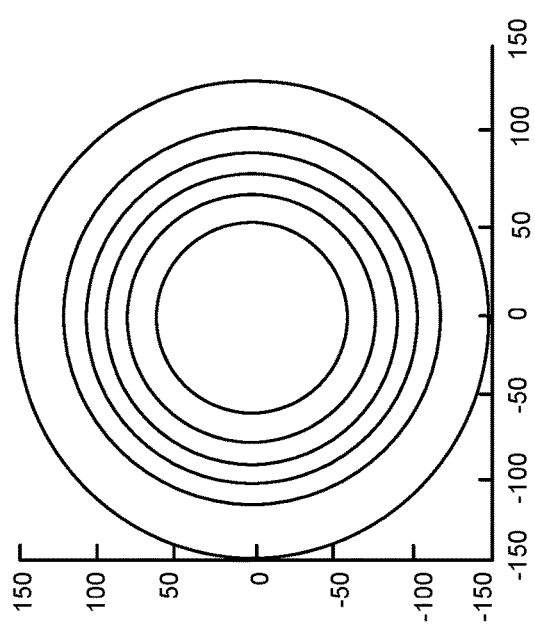
Figure 26J:
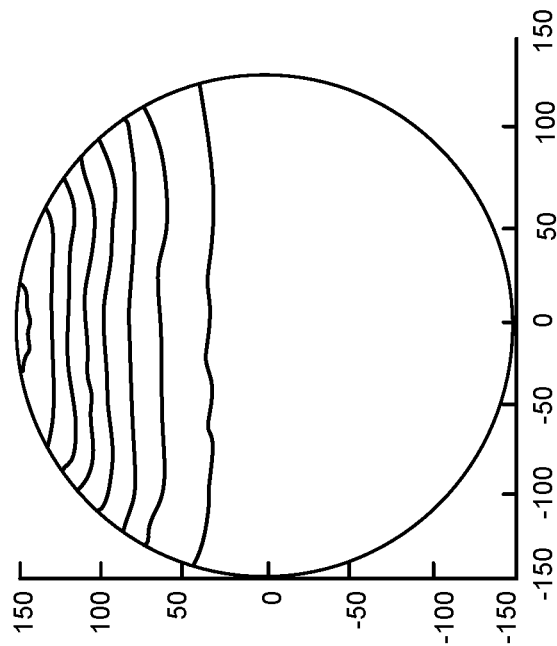
Figure 26I:
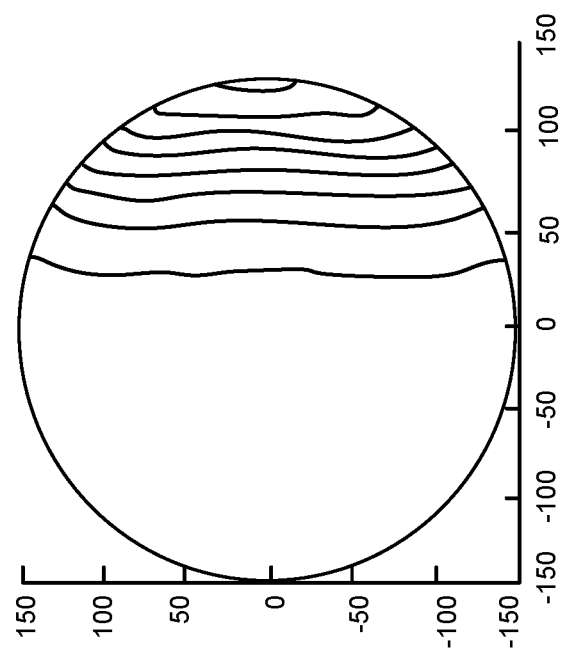

At 2513, the temperature controller 162 and/or the calibration/solving module 2401 collect temperature data for a third predetermined period of time (e.g., 10 seconds) and at a predetermined frequency (e.g., 4 Hz). The data may include identifying the current recipe, the TC substrate, the station, the TC substrate location and orientation, power parameters, and/or other related parameters. Example plots of temperature data collected for the TC substrate are shown in FIGS. 26A-J. Each area in the plots has a respective temperature range. The areas of the plot of FIG. 26A are designated A1-A11. The temperature ranges of each plot are different and, in general and for these example plots, the smaller the area, the hotter the area. Each of the plots of FIGS. 26A-D and 26F-J may refer to temperatures collected for a particular recipe when temperatures in a particular zone are increased. FIG. 26E may refer to initial temperatures or temperatures when a particular zone are not increased. At 2514, the temperature controller 162 and/or the calibration/solving module 2401 may export and/or store the collected temperature data and corresponding information as, for example, TDMS files.

At 2516, the temperature controller 162 and/or the calibration/solving module 2401 may determine whether calibration is to be performed for another one of the stations. If yes, operation 2518 may be performed, otherwise operation 2520 may be performed.

At 2518, one of the dummy substrates is removed from the next station to be calibrated and the TC substrate is loaded into that station. A dummy substrate is loaded in the station from which the TC substrate was removed. Automatic substrate centering is performed for the TC substrate and the loaded dummy substrate. The location and orientation of the TC substrate and the station ID is recorded.

At 2520, the temperature controller 162 and/or the calibration/solving module 2401 determines whether calibration is to be performed for another recipe. If yes, operation 2522 is performed, otherwise operation 2526 is performed.

At 2522, the process chamber is evacuated. At 2524, the substrates are removed from the process chamber. Operation 2506 may be performed subsequent to operation 2524.

At 2526, the calibration/solving module 2401 may determine one or more A-matrices including temperature calibration values for each of the stations based on the collected temperature data and other related information, which includes and/or is linked to the location and orientation of the TC substrate. As an example, an A-matrix for the TC substrate and a one of the stations may be determined using one or more of equations 5-6, where [T] is an n×1 column vector matrix including target temperatures, [W_T] is a n×n diagonal pointwise weighting matrix, [A_n] is a zone calibration A-matrix, [DC] is a duty cycle column vector matrix, [T0] is a matrix of initial temperatures, $T_{substrate}$ is a substrate temperature, $\Delta T_{substrate}$ is change in the temperature of the substrate, $P_{set}$ refers to a particular setpoint for a duty cycle, POWER is a generic (or actual) duty cycle, $T_{bp}$ is a specific baseplate (or setpoint) temperature of the substrate support, and $T_{baseplate}$ is a generic (or actual) temperature of the substrate support, where n is an integer greater than or equal to 2 and may refer to a number of measured points. Each of the stated temperatures may refer to a temperature of the TC substrate or a temperature of the corresponding substrate support depending on whether the TC substrate or the substrate support is being calibrated. Equation 5 may be rearranged to solve for the zone calibration A-matrix [A_n]. As an example, the duty cycle column vector matrix [DC] may be a 10×1 matrix including duty cycle target values.

$$[T] = \frac{[W_T]}{([W_T A_n]([DC] - [DC_0]))} + [T_0] \quad (5)$$

$$T_{substrate} = \frac{\Delta T_{substrate} \cdot P_{set}}{POWER} + \frac{\Delta T_{substrate} \cdot T_{bp}}{T_{baseplate}} \quad (6)$$

A sensor array calibration A-matrix [A_cal] may be interpolated to provide the zone calibration A-matrix [A_n]. As an example, the sensor array calibration A-matrix may be a 65×10 matrix and refer to temperature detection points of a sensor array of the TC substrate. The zone calibration A-matrix [A_n] may be a n×10 matrix. The calibration values of the zone calibration A-matrix [A_n] may correspond respectively to zones of the substrate support and/or TC substrate.

Subsequent to calibration and as an example, the column matrix [T] is provided as an input and the duty cycle matrix [DC] is determine based on the determined zone calibration A-matrix [A_n] using equation 5. The duty cycle matrix [DC] may be best fit for the column matrix [T]. As another example, the duty cycle matrix [DC] is provided as an input and the column matrix [T] is determined based on the determined zone calibration A-matrix [A_n] using equation 5. The column matrix [T] may be best fit for the duty cycle matrix [DC]. The duty cycle matrix [DC] may be determined using a least means square or a least square regression algorithm.

If points in the A-matrix are not uniform (e.g., there is a high density of points in a certain location because the system is providing a higher resolution for that location), then weights may be used to prioritize the values of certain points. The points may be prioritized based on, for example, user inputs. This weighting may take affect when providing a least squares regression solution for duty cycles. When there is a higher density of points in a certain location, an "overfitting" condition can result. The term "overfitting" refers to when there is more points in the sensor array calibration A-matrix [A_cal] than there are temperature zones. The method may end at 2528.

Subsequent to performing the above-described method, the TDMS files generated with the collected data and corresponding information for each of the iterations and preparation recipes are collected, the determined A-matrix (or A-matrices) may be validated. This may include loading the one or more A-matrices to the calibration/solving module 2401. A preparation recipe is run as described above while operating in a temperature mode, where the temperature of the process chamber and/or the substrate supports are set to a predetermined temperature (e.g., 50° C.). The calibration/solving module 2401 then waits a predetermined period (e.g., 60 minutes) as described above. The TC substrate is then loaded into the stations one at a time in the substrate flow order to detect temperatures. If the data points (i.e. measured temperatures) are within a predetermined range (e.g., ±0.5° C.) of the predetermined temperature, then the one or more A-matrices is validated. If the data points are outside the predetermined range (e.g., ±0.5° C.) of the predetermined temperature, then the calibration process of FIG. 25 may be repeated and/or a calibration error may be reported.

FIG. 27 shows an example sensitivity calibration method. This method may be performed subsequent to performing the method of FIG. 25 and/or subsequent to generation of the A-matrices. The following operations may be iteratively performed. The following operations may be performed by the temperature controller 162 and/or the calibration/solving module 2401.

The method may begin at 2700. At 2702, predetermined recipes and target substrate flow requirements are loaded into, for example, the temperature controller 162. The recipes may include, for example, species, pressures, flow rates, etc. The recipes may include other parameters as timing values, temperatures, etc. The target substrate flow requirements may refer to an order in which sets of stations are to be calibrated, which corresponds to an order in which one or more target substrates are to be placed in the stations for obtaining sensitivity calibration values associated with the target substrate(s) and the stations. For example, for a four station module, two of the stations may be target stations for a first iteration of this method and the other two stations may be target stations for a second iteration of this method. During each iteration, sets of calibration values are collected respectively for the target stations. The stated loading may include reception of a target profile as described above from a user or network device.

At 2704, the temperature controller 162 and/or the calibration/solving module 2401 sets a process chamber and substrate supports to predetermined initial temperatures. This may include setting predetermined initial power parameters of temperature control elements; and coolant temperatures, pressures and flow rates of the substrate supports.

At 2706, the temperature controller 162 and/or the calibration/solving module 2401 may (i) run the process chamber according to a first or next preparation recipe for at least a predetermined period to obtain steady-state, and (ii) initialize one or more controllers if not already completed. The first preparation recipe may be the same or different than that used to set the process chamber and the substrate supports to the predetermined initial temperatures. This may include increasing temperatures of one or more zones of the substrate support. Table 2 below provides an example of a series of preparation recipes being implemented through iterations of this method. During a first iteration, the initial condition may be unknown and the first preparation recipe may be identified as S0, which has a wait period of W1 minutes that is implemented at 2509. During a next iteration, the initial condition is known and is associated with or referred to as the preparation recipe S0 (or a last implemented preparation recipe) and a next preparation recipe is implemented. The initial condition may refer to temperatures of the process chamber and substrate supports as well as other states of the process chamber and substrate supports as a result of implementing the last preparation recipe.

TABLE 2

| Initial Condition | Preparation Recipe | Wait Period |
|---|---|---|
| Unknown/Any | S0 | W1 minutes |
| S0 | S1 | W1 minutes |
| S1 | S2 | W2 minutes |
| S2 | S3 | W3 minutes |
| S3 | S4 | W4 minutes |
| S4 | S5 | W5 minutes |
| S5 | S6 | W6 minutes |
| S6 | S7 | W7 minutes |
| S7 | S8 | W8 minutes |
| S8 | S9 | W9 minutes |
| S9 | S10 | W10 minutes |

At 2708, the temperature controller 162 and/or the calibration/solving module 2401 determines whether temperatures of the process chamber and the substrate supports (or top plates of the substrate supports) are greater than or equal to predetermined temperatures (e.g., the predetermined initial temperatures). If yes, operation 2709 is performed.

At 2709, the temperature controller 162 and/or the calibration/solving module 2401 determines whether a steady-state condition has been reached. This may include for example determining whether a first predetermined period has lapsed and/or whether temperatures of the process chamber and the substrate supports have stabilized for the first predetermined period (e.g., 10-60 minutes). The first predetermined (or wait) period is used for efficiency purposes. This allows the calibration associated with each recipe to be performed while waiting long enough for steady-state to occur for each iteration of this method. By knowing the initial condition (or condition associated with the last preparation recipe) and the new condition (or condition associated with the current preparation recipe), the amount of time to get to steady-state may be determined by the temperature controller 162 and/or the calibration/solving module 2401. The first predetermined period may be determined based on the determined amount of time to get to steady-state. The wait time is set based on the initial and new conditions. The wait time may be increased, for example, if power to one or more of the temperature control elements is lost, a wrong recipe is run, experiments are run out of order and/or a fault is detected. The wait time may be increased by a safe amount of time (e.g., 60 minutes).

At 2710, the temperature controller 162 and/or the calibration/solving module 2401 may charge the chemistry (or species) within the process chamber. At 2712, the temperature controller 162 and/or the calibration/solving module 2401 may determine which target stations to determine sensitivity values.

At 2714, blank substrates are loaded into respective target stations and on respective substrate supports of the process chamber. Dummy substrates may be loaded in non-target stations. If this is a second or higher iteration of this method and there are substrates disposed in the stations prior to performing this operation, then each of the previously loaded substrates may be (i) removed from the process chamber and replaced with another substrate, or (ii) moved to another one of the stations. Zero or more of the stations may be non-target stations. If dummy wafers are not loaded in the non-target stations, a verification is performed to determine that a handling sequence for each of the stations matches a predetermined handling sequence. The verification may include determining whether the blank and dummy substrates have: correct run paths, trajectory and placement; correct soak times; correct angular locations within respective stations; and/or a correct load sequence.

Automatic centering of the blank substrates on the corresponding substrate supports is performed. The blank substrates may include notches or other reference points. Locations of the reference points are recorded to indicate the angular positions of the blank substrates in the stations. The locations and orientations of the blank substrates, IDs of the blank substrates, IDs of the corresponding substrate supports, IDs of the corresponding stations, and an ID of the process chamber may be stored in memory and linked to data collected during operations 2716 and 2720.

At 2716, the metrology device 504 may perform a pre-scan and take physical critical dimension measurements and/or other measurements of the blank substrates to provide first measurement data. The first measurement data may include ellipsometry data.

At 2718, a predetermined target process may be run for each of the stations. This may be a trim or deposition process as described above. The target process may be run on all of the stations or a subset of the stations. In an embodiment, the target process is run on all of the stations until it is determined that there is consistency across the stations or consistency between front and back stations. The target process may be run simultaneously on two or more of the stations.

At 2719, the temperature controller 162 and/or the calibration/solving module 2401 may wait a predetermined period associated with the current recipe, examples of wait periods are shown in Table 2. The wait time may be increased, for example, if power to one or more of the temperature control elements is lost, a wrong recipe is run, experiments are run out of order and/or a fault is detected. The wait time may be increased by a safe amount of time (e.g., 60 minutes).

At 2720, the metrology device 504 may perform a post-scan and take physical critical dimension measurements and/or other measurements of the blank substrates to provide second measurement data, which is comparable to the first measurement data. The second measurement data may include ellipsometry data.

At 2722, the temperature controller 162 and/or the calibration/solving module 2401 may export and/or store the collected first measurement data and the second measurement data and corresponding information as, for example, TDMS files. The first and second measurement data and corresponding information may be stored in memory, which is accessible to the temperature controller 162 and the calibration/solving module 2401.

At 2724, the temperature controller 162 and/or the calibration/solving module 2401 may determine if there is another set of one or more target stations to be processed using the current recipe. If yes, operation 2714 may be performed, otherwise operation 2726 is performed.

At 2728, the process chamber is evacuated. At 2730, the blank and dummy substrates are removed from the process chamber. Operation 2706 may be performed subsequent to operation 2730.

The number of substrates evaluated for each station may be less than or equal to the number of iterations of this method, depending on the number of stations targeted (or tested) during each iteration. The number of substrates evaluated for each station may be equal to the number of recipes.

At 2726, the temperature controller 162 and/or the calibration/solving module 2401 determines whether calibration is to be performed for another recipe. If yes, operation 2728 may be performed, otherwise operation 2732 is performed.

At 2732, the calibration/solving module 2401 may determine one or more S-matrices including sensitivity calibration values for the blank substrates based on the collected metrology data (first and second measurement data) and the other related information, which includes and/or is linked to the locations and orientations of the substrates. As an example, an S-matrix for a substrate and a one of the stations may be determined using equation 7, where DTC refers to a target critical dimension (e.g., layer thickness or feature depth or width) as a result of a trim or deposition process, $\Delta Parameter_{substrate}$ is a change in a substrate parameter (e.g., a change in a critical dimension), $T_{substrate}$ is a substrate temperature, and $\Delta T_{substrate}$ is a change in the temperature of the substrate.

$$DTC = \frac{\Delta Parameter_{substrate} \cdot T_{substrate}}{\Delta T_{substrate}} \quad (7)$$

The method may end at 2734. The change in the substrate parameter $\Delta Parameter_{substrate}$ may be equal to a difference between corresponding values of the first and second measurement data, such as a difference between a first measurement of a dimension of a feature of a substrate and a second measurement of the dimension of the feature of the substrate after running the target process at 2718. The change in temperature $\Delta T_{substrate}$ may refer to the temperature of the feature (or corresponding portion of a substrate support) prior to running the target process and a temperature of the feature (or corresponding portion of a substrate support) subsequent to the target process.

The above-described operations of FIGS. 25 and 27 are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The above-described methods provide example implementations for estimating steady-state substrate temperatures as a function of inputs, such as power levels, current levels, voltages, duty cycles etc. of temperature control elements of substrate supports. The steady-state substrate temperatures are correlated to process results using a sensitivity model provided by S-matrices and used for process tuning to control, for example, film thicknesses of substrates and/or other temperature sensitive parameters. Temperatures across (or within) substrates are monitored and/or estimated and used for precise tuning of temperatures of the substrates. This includes use of a temperature model provided by A-matrices. Calibration data for the temperature model is collected using a TC substrate. The calibration data may be provided to a controller (e.g., the temperature controller 162) and/or the calibration module 522, which may then perform a linear regression on the measured temperature data versus the corresponding inputs to provide the A-matrices and thus the temperature model.

The solving module 520 may then estimate substrate temperatures during processing based on the A-matrices and/or temperature model for any given input. As an alternative, the temperature model may be inverted to determine recommended process input values (e.g., power levels, current levels, voltages, duty cycles, etc. of temperature control elements of substrate supports) based on provided or target substrate temperatures. In an embodiment, tuning is performed by a user providing a particular temperature or input parameter profile and the controller providing a best-fit solution including temperature control element parameters, substrate temperatures or substrate support temperatures. In a profile tuning mode, a process-specific sensitivity profile is calculated and the user provides a requested film property profile (e.g., a thickness profile) of a substrate. The solving module 520 inverts both the sensitivity model and the temperature model to calculate a best fit temperature control element input profile to satisfy the requested film property profile.

The use of a solving module 520 as disclosed decreases process development times and enables algorithm based hardware and process fine tuning to correct for tool-to-tool and station-to-station variation. The fine tuning is of substrate critical dimension profiles, for example, fine tuning a film thickness to ±3 Å. This fine tuning saves process time and eliminates the need for process engineers to perform trial and error processes on numerous substrates to find best temperature control element inputs that provide a best temperature profile to meet process requirements. This saves time and resources to find the best temperature control element inputs. The fine tuning also saves time and resources associated with replicating that trial and error process in each station and process chamber, since the best temperature control element inputs can be easily determined for each station and process chamber. A substrate temperature model may be used to: match target substrate temperatures across multiple stations and process chambers; apply corrections for tool-to-tool variability; and quickly tune new substrate process layers that may require different film property profiles.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
    a substrate support configured to support a first substrate and comprising a plurality of temperature control elements;
    a memory configured to store, for the plurality of temperature control elements, temperature calibration values and sensitivity calibration values;
    a calibration module configured to, during calibration of the plurality of temperature control elements, perform a first calibration process to determine the temperature calibration values, the first calibration process comprising i) calculating a system response of one of the plurality of temperature control elements based on a difference between measured temperatures of the one of the plurality of temperature control elements for different power levels, ii) inverting the system response, and iii) determining the temperature calibration values of the plurality of temperature control elements based on the inverted system response, and a second calibration process to determine the sensitivity calibration values, wherein the sensitivity calibration values relate at least one of trim amounts to temperature changes or deposition amounts to temperature changes;

an operating parameter module configured to determine a plurality of operating parameters for the plurality of temperature control elements based on the temperature calibration values and the sensitivity calibration values; and a solving module configured, subsequent to the calibration of the plurality of temperature control elements, to control operation of the plurality of temperature control elements during at least one of a trim step or a deposition step based on the plurality of operating parameters.

2. The substrate processing system of claim 1, wherein the calibration module is configured to, during the calibration of the plurality of temperature control elements, perform the first calibration process and the second calibration process.

3. The substrate processing system of claim 1, wherein:
the substrate support comprises a plurality of temperature controlled zones; and
each of the plurality of temperature controlled zones includes one or more of the plurality of temperature control elements.

4. The substrate processing system of claim 3, wherein the solving module is configured to perform at least one of open loop or closed loop control of each of the plurality of temperature controlled zones.

5. The substrate processing system of claim 3, wherein at least one of the plurality of temperature controlled zones or the plurality of temperature control elements is implemented in an open loop or a closed loop.

6. The substrate processing system of claim 3, wherein the solving module is configured to perform at least one of open loop or closed loop control of the plurality of temperature control elements.

7. The substrate processing system of claim 1, wherein the first calibration process includes:
adjusting a parameter of the plurality of temperature control elements by a predetermined amount;
determining temperature changes of the first substrate or the substrate support in response to the adjusted parameter; and
based on the predetermined amount and the determined temperature changes, generating the temperature calibration values.

8. The substrate processing system of claim 1, wherein the second calibration process includes:
determining a baseline critical dimension profile of a second substrate provided as a result of the plurality of temperature control elements being at first settings for a trim operation performed on the second substrate;
adjusting a parameter of at least one of the plurality of temperature control elements from one of the first settings to a second setting;
performing the trim operation on a third substrate;
measuring a post trim critical dimension profile for the third substrate; and
determining one of the sensitivity calibration values based on the baseline critical dimension profile, the post trim critical dimension profile and a difference between the one of the first settings and the second setting.

9. The substrate processing system of claim 1, wherein the second calibration process includes:
determining a baseline critical dimension profile of a second substrate provided as a result of the plurality of temperature control elements being at first settings for a deposition operation performed on the second substrate;
adjusting a parameter of at least one of the plurality of temperature control elements from one of the first settings to a second setting;
performing the deposition operation on a third substrate;
measuring a post deposition critical dimension profile for the third substrate; and
determining one of the sensitivity calibration values based on the baseline critical dimension profile, the post deposition critical dimension profile and a difference between the one of the first settings and the second setting.

10. The substrate processing system of claim 1, further comprising a user interface configured to receive a target profile,
wherein the solving module is configured to control operation of the plurality of temperature control elements during the at least one of the trim step or the deposition step based on the target profile.

11. The substrate processing system of claim 1, wherein:
the operating parameter module is configured to analyze the sensitivity calibration values and parameter variability for a predetermined process to determine radial tuning parameters; and
the solving module is configured to control operation of the plurality of temperature control elements during the at least one of the trim step or the deposition step based on the radial tuning parameters.

12. The substrate processing system of claim 1, wherein:
the operating parameter module is configured to analyze the sensitivity calibration values and azimuthal variability for a predetermined process to determine azimuthal tuning parameters; and
the solving module is configured to control operation of the plurality of temperature control elements during the at least one of the trim step or the deposition step based on the azimuthal tuning parameters.

13. The substrate processing system of claim 1, wherein:
the operating parameter module is configured to
determine a plurality of values corresponding to critical dimensions of a feature of the first substrate,
determine trim, pretrim and deposition values based on the plurality of values,
determine a total correction value based on the trim, pretrim, and deposition values, and
analyze the sensitivity calibration values, parameter variability and the total correction value for a predetermined process to determine radial tuning parameters; and
the solving module is configured to control operation of the plurality of temperature control elements during the at least one of the trim step or the deposition step based on the radial tuning parameters.

14. The substrate processing system of claim 1, wherein:
the operating parameter module is configured to
  determine critical dimension imbalance, and
  analyze the sensitivity calibration values, parameter variability and the critical dimension imbalance for a predetermined process to determine radial tuning parameters; and
the solving module is configured to control operation of the plurality of temperature control elements during the at least one of the trim step or the deposition step based on the radial tuning parameters.

15. A substrate processing system comprising:
a substrate support configured to support a first substrate and comprising a plurality of temperature control elements;
a memory configured to store, for the plurality of temperature control elements, temperature calibration values and sensitivity calibration values;
a calibration module configured to, during calibration of the plurality of temperature control elements, perform
  a first calibration process to determine the temperature calibration values, and
  a second calibration process to determine the sensitivity calibration values, wherein the sensitivity calibration values relate at least one of trim amounts to temperature changes or deposition amounts to temperature changes;
an operating parameter module configured to determine a plurality of operating parameters for the plurality of temperature control elements based on the temperature calibration values and the sensitivity calibration values, wherein the operating parameter module is configured to analyze the sensitivity calibration values and azimuthal variability for a predetermined process to determine azimuthal tuning parameters; and
a solving module configured, subsequent to the calibration of the plurality of temperature control elements, to control operation of the plurality of temperature control elements during at least one of a trim step or a deposition step based on the plurality of operating parameters including the azimuthal tuning parameters.

16. The substrate processing system of claim 15, wherein the operating parameter module is configured to analyze the azimuthal variability to generate azimuthal correction values for each station of the substrate processing system, and to adjust the plurality of operating parameters based on the azimuthal correction values.

17. The substrate processing system of claim 15, wherein the calibration module is configured to, during the calibration of the plurality of temperature control elements, perform the first calibration process and the second calibration process.

18. The substrate processing system of claim 15, wherein:
the substrate support comprises a plurality of temperature controlled zones; and
each of the plurality of temperature controlled zones includes one or more of the plurality of temperature control elements.

19. The substrate processing system of claim 15, wherein the first calibration process includes:
  adjusting a parameter of the plurality of temperature control elements by a predetermined amount;
  determining temperature changes of the first substrate or the substrate support in response to the adjusted parameter; and
  based on the predetermined amount and the determined temperature changes, generating the temperature calibration values.

20. The substrate processing system of claim 15, wherein the second calibration process includes:
  determining a baseline critical dimension profile of a second substrate provided as a result of the plurality of temperature control elements being at first settings for a trim operation performed on the second substrate;
  adjusting a parameter of at least one of the plurality of temperature control elements from one of the first settings to a second setting;
  performing the trim operation on a third substrate;
  measuring a post trim critical dimension profile for the third substrate; and
  determining one of the sensitivity calibration values based on the baseline critical dimension profile, the post trim critical dimension profile and a difference between the one of the first settings and the second setting.

21. The substrate processing system of claim 15, wherein the second calibration process includes:
  determining a baseline critical dimension profile of a second substrate provided as a result of the plurality of temperature control elements being at first settings for a deposition operation performed on the second substrate;
  adjusting a parameter of at least one of the plurality of temperature control elements from one of the first settings to a second setting;
  performing the deposition operation on a third substrate;
  measuring a post deposition critical dimension profile for the third substrate; and
  determining one of the sensitivity calibration values based on the baseline critical dimension profile, the post deposition critical dimension profile and a difference between the one of the first settings and the second setting.

22. The substrate processing system of claim 15, wherein the first calibration process comprises i) determining whether a difference between measured temperatures of one of the plurality of temperature control elements for different power levels fit a previously determined function, ii) calculating and inverting a system response in response to the difference fitting the previously determined function, and iii) determining the temperature calibration values of the plurality of temperature control elements based on the inverted system response provided in response to the difference.

* * * * *